United States Patent
Pitts et al.

(10) Patent No.: US 9,419,049 B2
(45) Date of Patent: Aug. 16, 2016

(54) OPTICAL ASSEMBLY INCLUDING PLENOPTIC MICROLENS ARRAY

(71) Applicant: Lytro, Inc., Mountain View, CA (US)

(72) Inventors: Colvin Pitts, Snohomish, WA (US); Yi-Ren Ng, Palo Alto, CA (US); Steven Oliver, San Jose, CA (US)

(73) Assignee: Lytro, Inc., Mountain View, CA (US)

( * ) Notice: Subject to any disclaimer, the term of this patent is extended or adjusted under 35 U.S.C. 154(b) by 0 days.

(21) Appl. No.: 15/053,947

(22) Filed: Feb. 25, 2016

(65) Prior Publication Data

US 2016/0181310 A1 Jun. 23, 2016

Related U.S. Application Data

(63) Continuation of application No. 14/871,703, filed on Sep. 30, 2015, now Pat. No. 9,305,956, which is a continuation of application No. 13/560,138, filed on Jul. 27, 2012, now Pat. No. 9,184,199.

(60) Provisional application No. 61/513,844, filed on Aug. 1, 2011.

(51) Int. Cl.
*H01L 27/146* (2006.01)
*G02B 3/00* (2006.01)
(Continued)

(52) U.S. Cl.
CPC ........ *H01L 27/14685* (2013.01); *G02B 3/0031* (2013.01); *G02B 3/0056* (2013.01); *G02B 3/0062* (2013.01); *G02B 3/0075* (2013.01); *G02B 13/0085* (2013.01);
(Continued)

(58) Field of Classification Search
None
See application file for complete search history.

(56) References Cited

U.S. PATENT DOCUMENTS

| 725,567 A | 4/1903 | Ives |
| 4,383,170 A | 5/1983 | Takagi et al. |

(Continued)

FOREIGN PATENT DOCUMENTS

| DE | 19624421 | 6/1996 |
| WO | 03052465 | 6/2003 |

(Continued)

OTHER PUBLICATIONS

Adelson et al., "Single Lens Stereo with a Plenoptic Camera" IEEE Translation on Pattern Analysis and Machine Intelligence, Feb. 1992. vol. 14, No. 2, pp. 99-106.

(Continued)

*Primary Examiner* — Roberto Velez
*Assistant Examiner* — Stephen Coleman
(74) *Attorney, Agent, or Firm* — Raubvogel Law Office

(57) ABSTRACT

An optical assembly includes a solid spacing layer between a plenoptic microlens array (MLA) and a pixel-level MLA, avoiding the need for an air gap. Such an assembly, and systems and methods for manufacturing same, can yield improved reliability and efficiency of production, and can avoid many of the problems associated with prior art approaches. In at least one embodiment, the plenoptic MLA, the spacing layer, and the pixel-level MLA are created from optically transmissive polymer(s) deposited on the photosensor array and shaped using photolithographic techniques. Such an approach improves precision in placement and dimensions, and avoids other problems associated with conventional polymer-on-glass architectures. Further variations and techniques are described.

33 Claims, 15 Drawing Sheets

(51) Int. Cl.
*G02B 13/00* (2006.01)
*H04N 13/02* (2006.01)

(52) U.S. Cl.
CPC ... *H01L 27/14627* (2013.01); *H01L 27/14645* (2013.01); *H04N 13/0228* (2013.01)

(56) References Cited

U.S. PATENT DOCUMENTS

| | | | |
|---|---|---|---|
| 4,661,986 A | 4/1987 | Adelson | |
| 4,694,185 A | 9/1987 | Weiss | |
| 4,920,419 A | 4/1990 | Easterly | |
| 5,076,687 A | 12/1991 | Adelson | |
| 5,282,045 A | 1/1994 | Mimura et al. | |
| 5,610,390 A | 3/1997 | Miyano | |
| 5,748,371 A | 5/1998 | Cathey, Jr. et al. | |
| 5,757,423 A | 5/1998 | Tanaka et al. | |
| 5,949,433 A | 9/1999 | Klotz | |
| 6,023,523 A | 2/2000 | Cohen et al. | |
| 6,028,606 A | 2/2000 | Kolb et al. | |
| 6,097,394 A | 8/2000 | Levoy et al. | |
| 6,201,899 B1 | 3/2001 | Bergen | |
| 6,221,687 B1 | 4/2001 | Abramovich | |
| 6,320,979 B1 | 11/2001 | Melen | |
| 6,483,535 B1 | 11/2002 | Tamburrino et al. | |
| 6,577,342 B1 | 6/2003 | Wester | |
| 6,587,147 B1 | 7/2003 | Li | |
| 6,597,859 B1 | 7/2003 | Leinhart et al. | |
| 6,842,297 B2 | 1/2005 | Dowski, Jr. et al. | |
| 6,900,841 B1 | 5/2005 | Mihara | |
| 6,927,922 B2 | 8/2005 | George et al. | |
| 7,034,866 B1 | 4/2006 | Colmenarez et al. | |
| 7,336,430 B2 | 2/2008 | George et al. | |
| 7,620,309 B2 | 11/2009 | Georgiev | |
| 7,623,726 B1 | 11/2009 | Georgiev | |
| 7,687,757 B1 | 3/2010 | Tseng et al. | |
| 7,723,662 B2 | 5/2010 | Levoy et al. | |
| 7,936,392 B2 | 5/2011 | Ng et al. | |
| 7,949,252 B1 | 5/2011 | Georgiev | |
| 8,155,478 B2 | 4/2012 | Vitsnudel et al. | |
| 9,184,199 B2 | 11/2015 | Pitts et al. | |
| 2001/0048968 A1 | 12/2001 | Cox et al. | |
| 2002/0159030 A1 | 10/2002 | Frey et al. | |
| 2003/0103670 A1 | 6/2003 | Schoelkopf et al. | |
| 2003/0117511 A1 | 6/2003 | Belz et al. | |
| 2003/0156077 A1 | 8/2003 | Balogh | |
| 2004/0114176 A1 | 6/2004 | Bodin et al. | |
| 2004/0257360 A1 | 12/2004 | Sieckmann | |
| 2005/0080602 A1 | 4/2005 | Snyder et al. | |
| 2006/0130017 A1 | 6/2006 | Cohen et al. | |
| 2006/0208259 A1 | 9/2006 | Jeon | |
| 2007/0071316 A1 | 3/2007 | Kubo | |
| 2007/0230944 A1 | 10/2007 | Georgiev | |
| 2007/0252074 A1 | 11/2007 | Ng et al. | |
| 2008/0007626 A1 | 1/2008 | Wernersson | |
| 2008/0018668 A1 | 1/2008 | Yamauchi | |
| 2008/0131019 A1 | 6/2008 | Ng | |
| 2008/0152215 A1 | 6/2008 | Horie et al. | |
| 2008/0180792 A1 | 7/2008 | Georgiev | |
| 2008/0187305 A1 | 8/2008 | Raskar et al. | |
| 2008/0193026 A1 | 8/2008 | Horie et al. | |
| 2008/0226274 A1 | 9/2008 | Spielberg | |
| 2008/0266655 A1 | 10/2008 | Levoy et al. | |
| 2008/0309813 A1 | 12/2008 | Watanabe | |
| 2009/0027542 A1 | 1/2009 | Yamamoto et al. | |
| 2009/0041381 A1 | 2/2009 | Georgiev et al. | |
| 2009/0041448 A1 | 2/2009 | Georgiev et al. | |
| 2009/0102956 A1 | 4/2009 | Georgiev | |
| 2009/0128658 A1 | 5/2009 | Hayasaka et al. | |
| 2009/0128669 A1 | 5/2009 | Ng et al. | |
| 2009/0140131 A1 | 6/2009 | Utagawa | |
| 2009/0185801 A1 | 7/2009 | Georgiev et al. | |
| 2009/0268970 A1 | 10/2009 | Babacan | |
| 2009/0273843 A1 | 11/2009 | Raskar et al. | |
| 2009/0295829 A1 | 12/2009 | Georgiev et al. | |
| 2009/0321861 A1 | 12/2009 | Oliver et al. | |
| 2010/0026852 A1 | 2/2010 | Ng et al. | |
| 2010/0128145 A1 | 5/2010 | Pitts et al. | |
| 2010/0129048 A1 | 5/2010 | Pitts et al. | |
| 2010/0141802 A1 | 6/2010 | Knight et al. | |
| 2010/0277629 A1 | 11/2010 | Tanaka | |
| 2011/0013074 A1 | 1/2011 | Ichimura et al. | |
| 2011/0129165 A1 | 6/2011 | Lim et al. | |
| 2011/0221947 A1 | 9/2011 | Awazu | |
| 2012/0014837 A1 | 1/2012 | Fehr et al. | |
| 2012/0050562 A1 | 3/2012 | Perwass et al. | |
| 2013/0033636 A1 | 2/2013 | Pitts et al. | |
| 2016/0027831 A1 | 1/2016 | Pitts et al. | |

FOREIGN PATENT DOCUMENTS

| | | |
|---|---|---|
| WO | 2006039486 | 4/2006 |
| WO | 2007092545 | 8/2007 |
| WO | 2007092581 | 8/2007 |

OTHER PUBLICATIONS

Agarwala, A., et al., "Interactive Digital Photomontage," ACM Transactions on Graphics, Proceedings of SIGGRAPH 2004, vol. 32, No. 3, 2004.

Jin-Xang Chai et al., "Plenoptic Sampling", ACM SIGGRAPH 2000, Annual Conference Series, 2000, pp. 307-318.

Dowski et al., "Wavefront coding: a modem method of achieving high performance and/or low cost imaging systems" SPIE Proceedings, vol. 3779.

Georgiev, T., et al., "Spatio-Angular Resolution Tradeoff in Integral Photography," Proceedings of Eurographics Symposium on Rendering, 2006.

Gortler et al., "The lumigraph" SIGGRAPH 96, pp. 43-54.

Haeberli, "A Multifocus Method for Controlling Depth of Field" GRAPHICA Obscura, 1994, pp. 1-3.

Isaksen, A., et al., "Dynamically Reparameterized Light Fields," SIGGRAPH 2000, pp. 297-306.

Ives, H., "Optical properties of a Lippman lenticulated sheet," J. Opt. Soc. Am. 21, 171 (1931).

Jackson et al., "Selection of a Convolution Function for Fourier Inversion Using Gadding" IEEE Transactions on Medical Imaging, Sep. 1991, vol. 10, No. 3, pp. 473-478.

Levoy, M., et al., "Light Field Microscopy," ACM Transactions on Graphics, vol. 25, No. 3, Proceedings SIGGRAPH 2006.

Levoy, M.,"Light Field Rendering" SIGGRAPH 96 Proceeding, 1996. pp. 31-42.

Levoy, "Light Fields and Computational Imaging" IEEE Computer Society, Aug. 2006, pp. 46-55.

Lippmann, "Reversible Prints", Communication at the French Society of Physics, Journal of Physics, 7 , Mar. 4, 1908, pp. 821-825.

Lumsdaine et al., "Full Resolution Lightheld Rendering" Adobe Technical Report Jan. 2008, pp. 1-12.

Naemura et al., "3-D Computer Graphics based on Integral Photography" Optics Express, Feb. 12, 2001. vol. 8, No. 2, pp. 255-262.

Ng, R., et al. "Light Field Photography with a Hand-held Plenoptic Camera," Stanford Technical Report, CSTR 2005-2, 2005.

Ng, R., "Digital Light Field Photography," Dissertation, Department of Computer Science, Stanford University, Jun. 2006.

Ng., R., "Fourier Slice Photography," ACM Transactions on Graphics, Proceedings of SIGGRAPH 2005, vol. 24, No. 3, 2005, pp. 735-744.

Okano et al., "Three-dimensional video system based on integral photography" Optical Engineering, Jun. 1999. vol. 38, No. 6, pp. 1072-1077.

Sokolov, "Autostereoscopy and Integral Photography by Professor Lippmann's Method" , 1911, pp. 23-29.

Tanida et al., "Thin observation module by bound optics (TOMBO): concept and experimental verification"Applied Optics 40, 11 (April), pp. 1806-1813.

Vaish, V., et al., "Synthetic Aperture Focusing Using a Shear-Warp Factorization of the Viewing Transform," Workshop on Advanced 3D Imaging for Safety and Security (in conjunction with CVPR 2005), 2005.

(56) References Cited

OTHER PUBLICATIONS

Vaish et al., "Using plane + parallax for calibrating dense camera arrays", In Proceedings CVPR 2004, pp. 2-9.
Wilburn et al., "High Performance Imaging using Large Camera Arrays", ACM Transactions on Graphics (TOG), vol. 24, Issue 3 (Jul. 2005), Proceedings of ACM SIGGRAPH 2005, pp. 765-776.
Adobe Systems Incorporated, "XMP Specification", Sep. 2005.
Fitzpatrick, Brad, "Camlistore", Feb. 1, 2011.
Adelson, E. H., and Bergen, J. R. 1991. The plenoptic function and the elements of early vision. In Computational Models of Visual Processing, edited by Michael S. Landy and J. Anthony Movshon. Caambridge, Mass.: mit Press.
Daly, D., "Microlens Array". Retrieved Jan. 2013.
Georgiev, T., et al., Plenoptic Camera 2.0 (2008).
Georgiev,, T., et al., "Unified Frequency Domain Analysis of Lightfield Cameras" (2008).
Hirigoyen, F., et al., "1.1 um Backside Imager vs. Frontside Image: an optics-dedicated FDTD approach", IEEE 2009 International Image Sensor Workshop.
Lesser, Michael, "Back-Side Illumination", 2009.
Mallat, Stephane, "A Wavelet Tour of Signal Processing", Academic Press 1998.
Nakamura, J., "Image Sensors and Signal Processing for Digital Still Cameras" (Optical Science and Engineering), 2005.
Ogden, J., "Pyramid-Based Computer Graphics", 1985.
Pain, B., "Back-Side Illumination Technology for SOI-CMOS Image Sensors", 2009.
Story, D., "The Future of Photography", Optics Electronics, Oct. 2008.
Wuu, S., et al., "Back-Side Illumination Technology using Bulk-si Substrate for Advanced CMOS Image Sensors", 2009 International Image Sensor Workshop, Bergen, Norway.
Wuu, S., et al., "BSI Technology with Bulk Si Wafer", 2009 International Image Sensor Workshop, Bergen, Norway.
Zoberbier, M., et al., "Wafer Level Cameras", 2009 International Image Sensor Workshop, Bergen, Norway.
Teranishi, N., "Evolution of Optical Structure in Image Sensors", Electron Devices Meeting (IEDM) 2012 IEEE International.
Wipperman, F., "Chirped Refractive Microlens Array", Dissertation 2007.

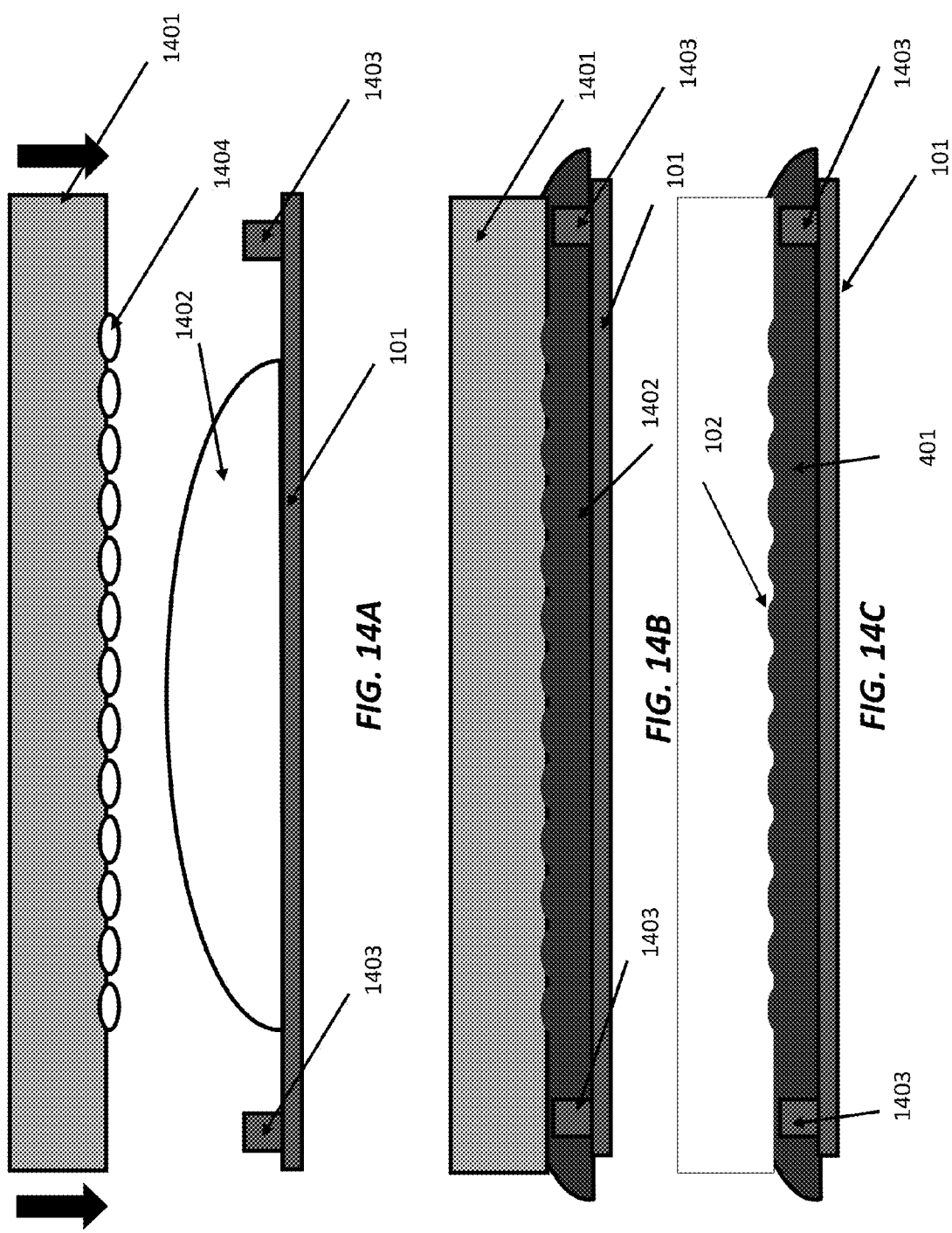

OPTICAL ASSEMBLY INCLUDING PLENOPTIC MICROLENS ARRAY

CROSS-REFERENCE TO RELATED APPLICATION

The present application claims priority as a continuation of U.S. Utility application Ser. No. 14/871,703 for "Optical Assembly Including Plenoptic Microlens Array," filed Sep. 30, 2015, the disclosure of which is incorporated herein by reference.

U.S. Utility application Ser. No. 14/871,703 claimed priority as a continuation of U.S. Utility application Ser. No. 13/560,138 for "Optical Assembly Including Plenoptic Microlens Array," filed Jul. 27, 2012, the disclosure of which is incorporated herein by reference.

U.S. Utility application Ser. No. 13/560,138 claimed priority from U.S. Provisional Application Ser. No. 61/513,844 for "System and Method for Manufacturing Plenoptic Microlens Array,"ket No. LYT014-PROV, filed Aug. 1, 2011, the disclosure of which is incorporated herein by reference.

The present application is further related to U.S. Utility application Ser. No. 12/632,979 for "Light-field Data Acquisition Devices, and Methods of Using and Manufacturing Same," filed Dec. 8, 2009, issued as U.S. Pat. No. 8,289,440 on Oct. 16, 2012, the disclosure of which is incorporated herein by reference.

FIELD OF THE INVENTION

The present invention relates to an optical assembly including a plenoptic microlens array such as can be used in a light-field camera to capture directional information for light rays passing through the camera's optics.

BACKGROUND

Light-field cameras, which may also be referred to as plenoptic cameras, use a plenoptic microlens array (MLA), in combination with a photosensor array, to capture directional information of light rays passing through the camera's optics. Such directional information can be used for providing and implementing advanced display of and interaction with captured pictures, such as refocusing after capture. Such techniques are described, for example, in Ng et al., "Light Field Photography with a Hand-Held Plenoptic Camera", Technical Report CSTR 2005-02, Stanford Computer Science, and in related U.S. Utility application Ser. No. 12/632,979 for "Light-field Data Acquisition Devices, and Methods of Using and Manufacturing Same," (Atty. Docket No. LYT3002), filed Dec. 8, 2009, the disclosure of which is incorporated herein by reference.

Plenoptic microlens arrays are often manufactured using a polymer-on-glass approach, including a stamping or replication process wherein the plenoptic MLA is fabricated as a polymer attached to a transparent glass surface. Plenoptic MLAs can be constructed in such a manner using machines and processes available, for example, from Suss MicroOptics of Neuchatel, Switzerland. The polymer-on-glass MLA array is placed with the lens side down, such that incoming light passes through the glass and is then directed by the plenoptic MLA onto the surface of a photosensor array.

Referring now to FIG. 1A, there is shown an example of an assembly 100 for a light-field camera according to the prior art, wherein the plenoptic MLA 102, including any number of individual microlenses 116, is constructed using a polymer-on-glass approach, resulting in MLA 102 being fabricated on glass 103. An air gap 105 has been introduced between plenoptic MLA 102 and photosensor array 101 of the device, to allow for light rays to be properly directed to correct locations on photosensor array 101.

In general, existing techniques for manufacturing a light field sensor require that photosensor array 101 and plenoptic MLA 102 be fabricated as separate components. These components may be assembled using a mechanical separator that adds air gap 105 between the components. Such an assembly process can be expensive and cumbersome; furthermore, the resulting air gap 105 is a potential source of misalignment, unreliability, and/or reduced optical performance. It is desirable to avoid such separate fabrication of parts and later assembly using mechanical separation so as to improve manufacturing efficiency, and so that precision in placement of the lens components can be achieved.

In many image capture devices, a different type of microlens array, referred to herein as a pixel-level microlens array, is used to improve light capture performance and/or reduce crosstalk between neighboring pixels in a photosensor array 101. Referring now to FIG. 1B, there is shown an example of an assembly 150 according to the prior art. Relative to FIG. 1A, this diagram is shown at much higher magnification. Microlenses 206 in pixel-level microlens array 202 direct incoming light 104 so as to maximize the amount of light that reaches each individual photosensor 106, and to avoid losing light that would otherwise hit the areas between individual photosensors 106. Such an arrangement is well known in the art, and may be included on many commercially available image sensors.

The plenoptic microlens array 102 depicted in FIG. 1A and the pixel-level microlens array 202 depicted in FIG. 1B serve completely different purposes. In general, these two types of microlens arrays are constructed to be of differing sizes and locations. For example, each microlens 206 of pixel-level microlens array 202 may be approximately 2 microns across, while each microlens 116 of the plenoptic microlens array 102 may be approximately 20 microns across. These measurements are merely examples. In general, pixel-level microlenses 206 may have a 1:1 relationship with photosensors 106, while plenoptic microlenses 116 may have a 1:many relationship with photosensors 106.

Referring now to FIG. 2, there is shown an optical assembly 200 including both a plenoptic MLA 102 and a pixel-level MLA 202 according to the prior art. Such an assembly 200 effectively combines the components depicted and described in connection with FIGS. 1A and 1B. Here, plenoptic MLA 102 directs incoming light 104 toward pixel-level MLA 202. Microlenses 206 in pixel-level MLA 202 then further direct light toward individual photosensors 106 in photosensor array 101. In the arrangement of FIG. 2, air gap 105 is provided between plenoptic MLA 102 and pixel-level MLA 202.

As described above, plenoptic MLA 102 of FIG. 2 can be constructed using a polymer-on-glass approach, wherein plenoptic MLA 102 is attached to glass surface 103. For example, plenoptic MLA 102 may be formed using a mold that is stamped out using polymer and affixed to glass surface 103. The resulting plano-convex microlens assembly is positioned in a "face-down" manner as shown in FIG. 2, with the convex lens surfaces facing away from the light source.

The inclusion of both a plenoptic MLA 102 and a pixel-level MLA 202 serves to further complicate the construction of the image capture apparatus. Existing techniques offer no reliable method for constructing an image capture apparatus that employs both a plenoptic MLA 102 and a pixel-level MLA 202, without introducing an air gap 105. Introduction of such an air gap 105 potentially introduces further complexity, cost, and potential for misalignment.

SUMMARY

According to various embodiments of the present invention, an improved system and method of manufacturing an optical assembly including a plenoptic microlens array are described. Further described is an improved optical assembly including a plenoptic microlens array, fabricated according to such an improved manufacturing method. The various systems, methods, and resulting optical assembly described herein yield improved reliability and efficiency of production, and avoid many of the problems associated with prior art approaches.

According to various embodiments of the present invention, an optical assembly including a plenoptic microlens array (MLA) is fabricated without the need to introduce an air gap between the plenoptic MLA and other components of the optical system. In at least one embodiment, the plenoptic MLA, along with a solid spacing layer, is manufactured in such a manner that it is integrated with the photosensor array. For example, in at least one embodiment, the plenoptic MLA is created from an optical polymer deposited on the photosensor array, and then shaped using photolithographic techniques. The use of the solid spacing layer avoids the need for an air gap between the plenoptic MLA and other components.

Such an approach improves precision in placement and dimensions, and avoids other problems associated with polymer-on-glass architectures. The use of a photolithographic process also allows the plenoptic microlens array to be positioned in a face-up manner, so as to improve optical performance. Misalignment and imprecision resulting from assembly can also be reduced or eliminated. In addition, the photolithographic approach allows for more precise alignment of the plenoptic microlens array relative to the photosensor array.

In at least one embodiment, the plenoptic MLA is constructed together with a pixel-level MLA, without the need for an air gap between the two MLA's. The plenoptic MLA, along with a solid spacing layer, are fabricated directly atop the pixel-level MLA. Such a technique provides the added functionality associated with a pixel-level MLA while avoiding problems associated with prior art approaches that involve the use of an air gap.

The present invention also provides additional advantages, as will be made apparent in the description provided herein.

BRIEF DESCRIPTION OF THE DRAWINGS

The accompanying drawings illustrate several embodiments of the invention and, together with the description, serve to explain the principles of the invention according to the embodiments. One skilled in the art will recognize that the particular embodiments illustrated in the drawings are merely exemplary, and are not intended to limit the scope of the present invention.

FIGS. 14A through 14C are a series of cross-sectional diagrams depicting an example of fabrication of a microlens array using a stamping method, according to an embodiment of the present invention.

DETAILED DESCRIPTION OF THE EMBODIMENTS

According to various embodiments of the present invention, optical assemblies are constructed that avoid the need for an air gap between a plenoptic microlens array (MLA) and other components. In at least one embodiment, a photolithographic process is used, wherein a spacing layer containing solid spacing material is introduced between the plenoptic MLA and other components, so as to avoid the need for an air gap.

For illustrative purposes, various configurations of optical assemblies including plenoptic MLA's are described herein. One skilled in the art will recognize that the particular configurations depicted herein are exemplary only, and that other configurations, arrangements, and manufacturing techniques can be implemented without departing from the essential characteristics of the claimed invention.

In at least one embodiment, the various optical assemblies described and depicted herein can be implemented as part of any suitable image capture device, such as a camera. For example, any of such optical assemblies can be implemented as part of a light-field camera such as described in Ng et al., and/or in related U.S. Utility application Ser. No. 12/632,979 for "Light-field Data Acquisition Devices, and Methods of Using and Manufacturing Same," filed Dec. 8, 2009, the disclosure of which is incorporated herein by reference. Such a light-field camera can be designed to capture and store directional information for the light rays passing through the camera's optics. Such directional information can be used for providing and implementing advanced display of and interaction with captured pictures, such as refocusing after capture. One skilled in the art will recognize, however, that the techniques described herein can be applied to other types of devices and apparatuses, and are not necessarily limited to light-field cameras.

Figure 3:
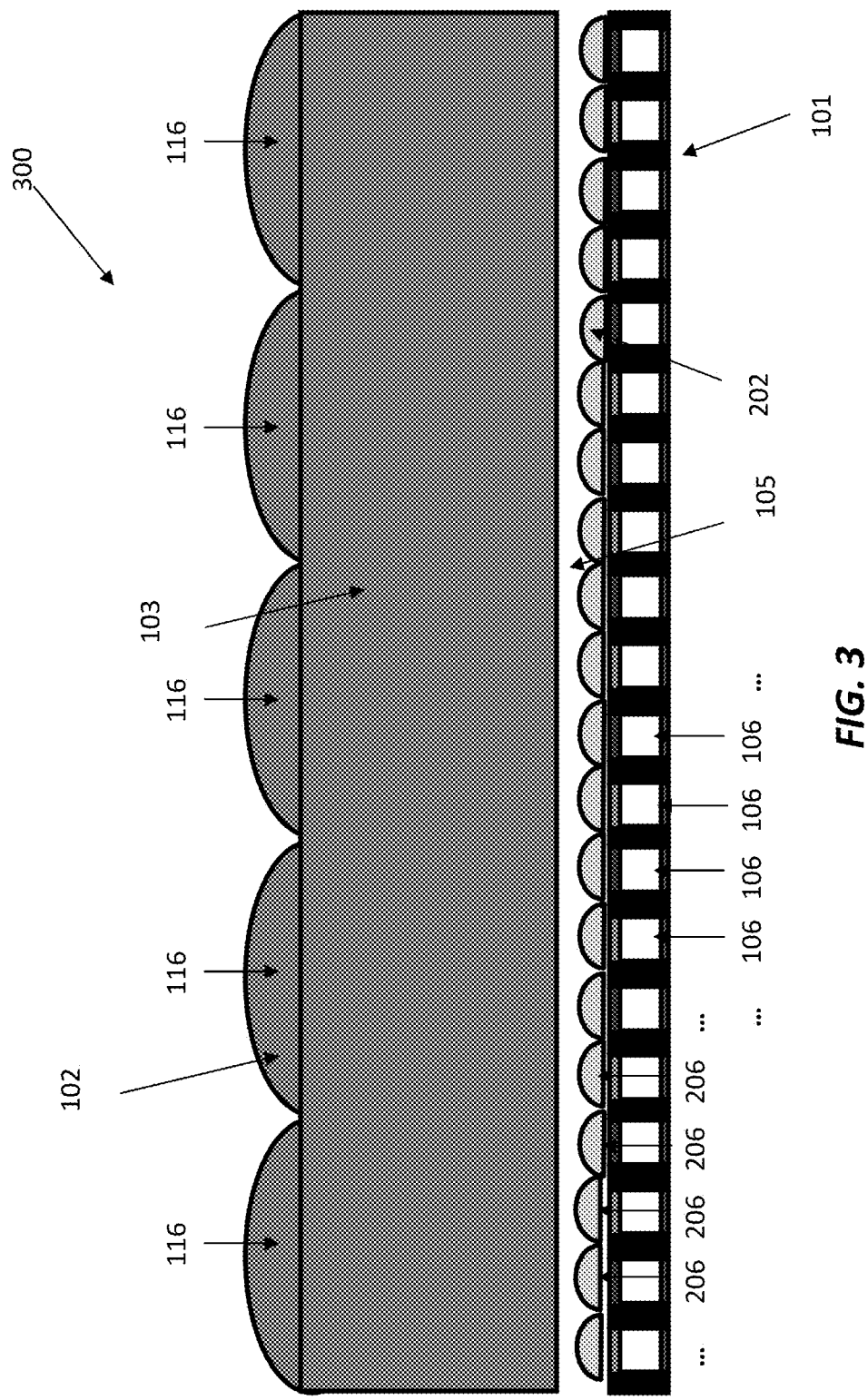
FIG. 3 is a cross-sectional diagram depicting a detail of an optical assembly including both a plenoptic MLA positioned in a face-up manner and a pixel-level MLA, constructed according to an embodiment of the present invention.

Referring now to FIG. 3, there is an optical assembly 300 including both a plenoptic MLA 102 and a pixel-level MLA 202, wherein plenoptic MLA 102 is positioned "face-up", i.e., with the convex lens surfaces facing toward the light source, according to one embodiment of the present invention. In at least one embodiment, such a configuration can provide improved optical performance. However, existing polymer-on-glass approaches can make such an arrangement difficult to achieve, because glass 103 may be too thick to allow proper and accurate positioning of the convex lens elements of plenoptic MLA 102 at the appropriate distance from pixel-level MLA 202.

Figure 1A:
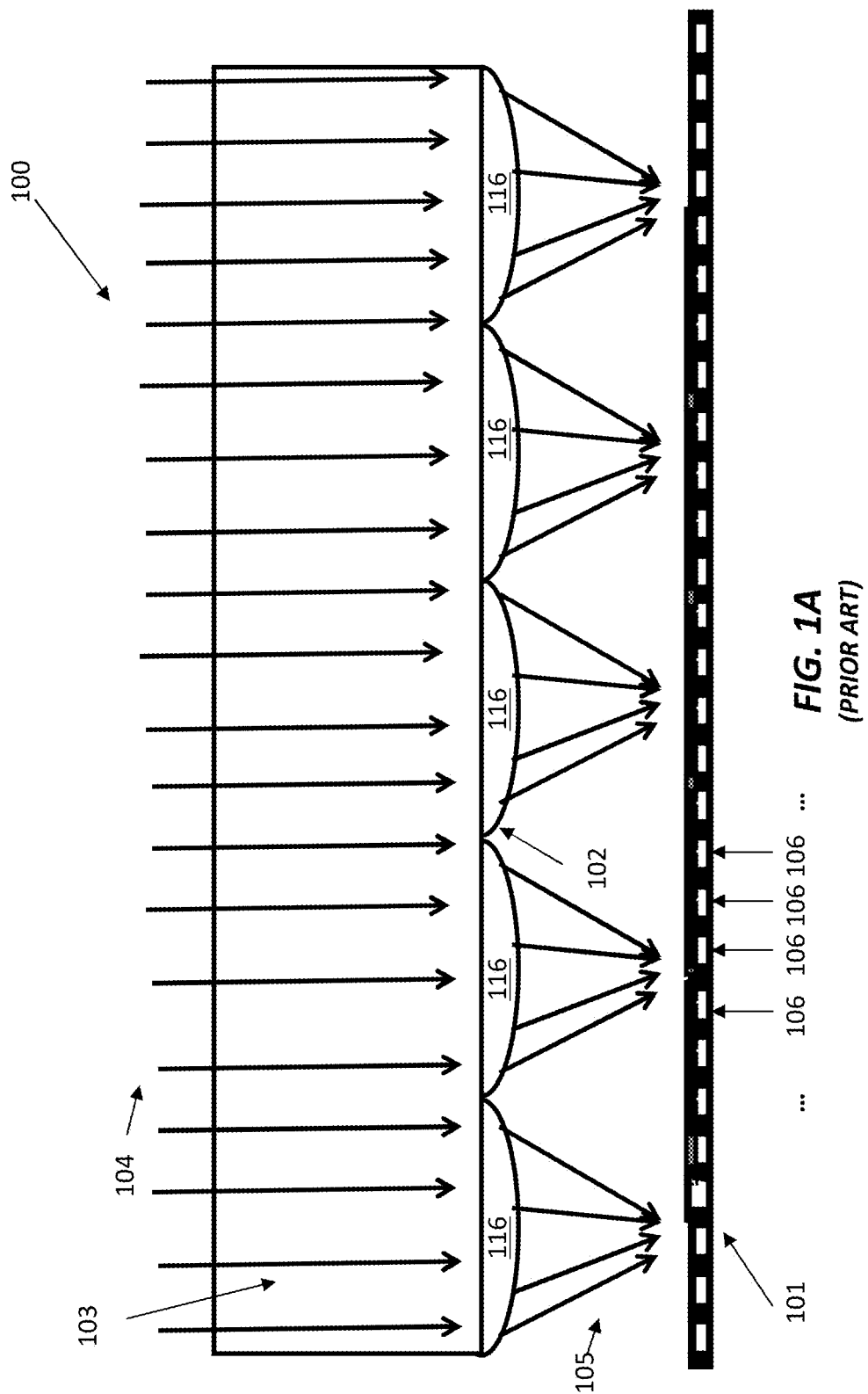
FIG. 1A is a cross-sectional diagram depicting a detail of an optical assembly including a plenoptic MLA constructed according to the prior art and positioned in a face-down manner.
Figure 1B:
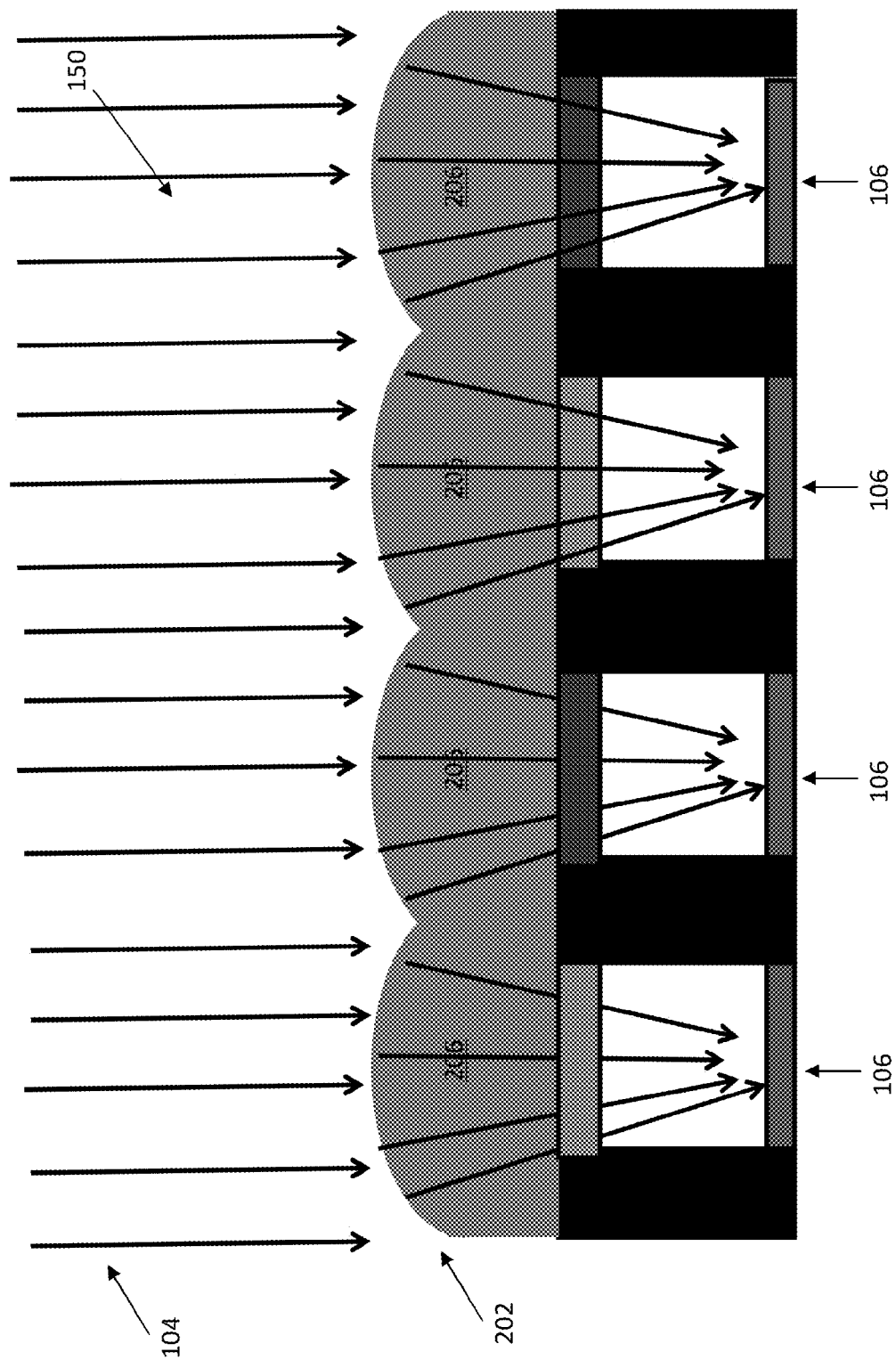
FIG. 1B is a cross-sectional diagram depicting a detail of an optical assembly including a pixel-level MLA constructed according to the prior art.
Figure 2:
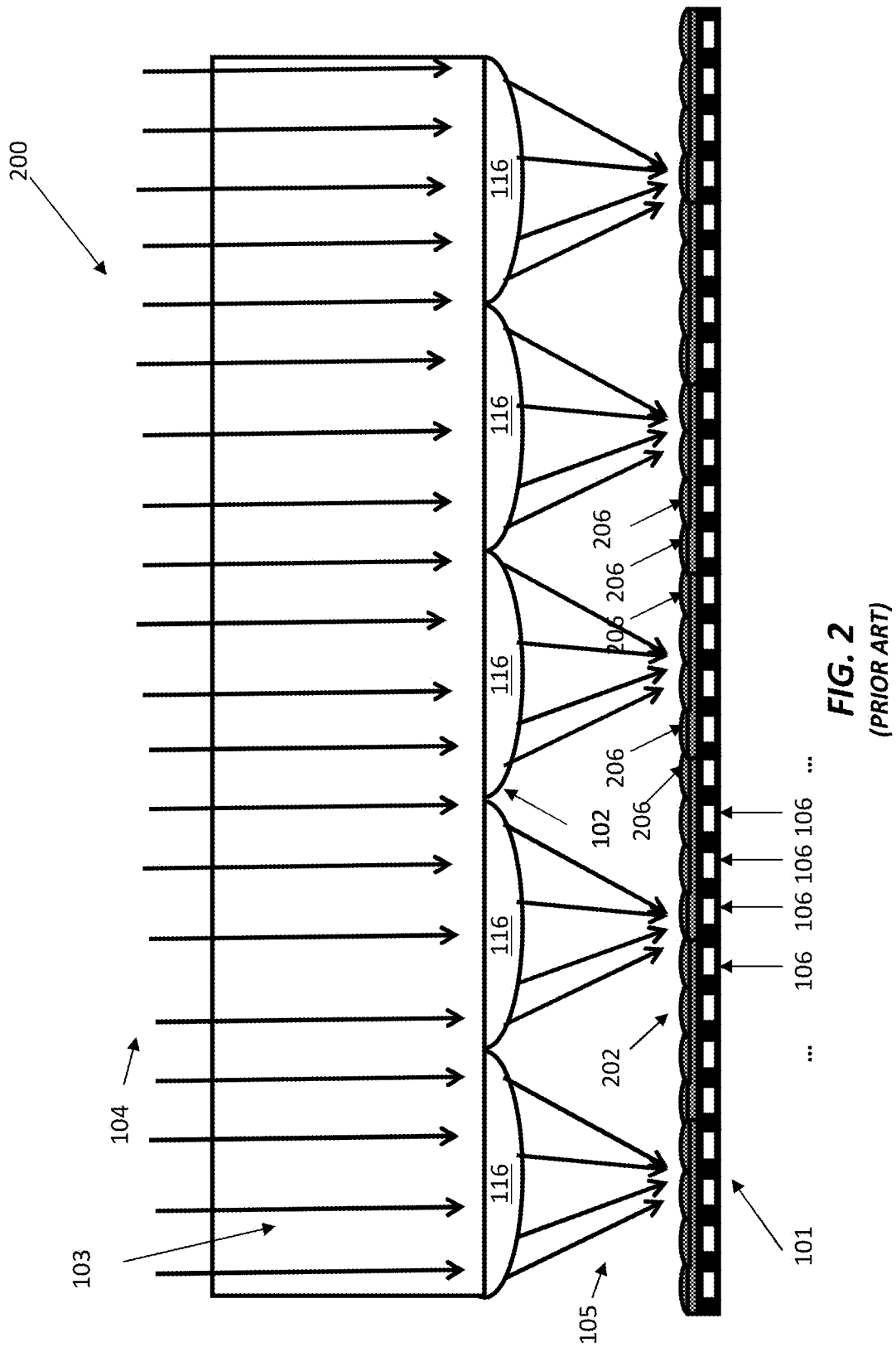
FIG. 2 is a cross-sectional diagram depicting a detail of an optical assembly including both a plenoptic MLA positioned in a face-down manner and a pixel-level MLA, according to the prior art.

The approaches in FIGS. 2 and 3 both involve separate construction of photosensor array 101 and plenoptic MLA 102; the components are then assembled using a mechanical separator that adds air gap 105 between the components. As discussed above, the resulting air gap 105 can also be a source of misalignment, unreliability, and/or reduced optical performance.

Integration of Plenoptic MLA with Photosensor Array

Figure 4:
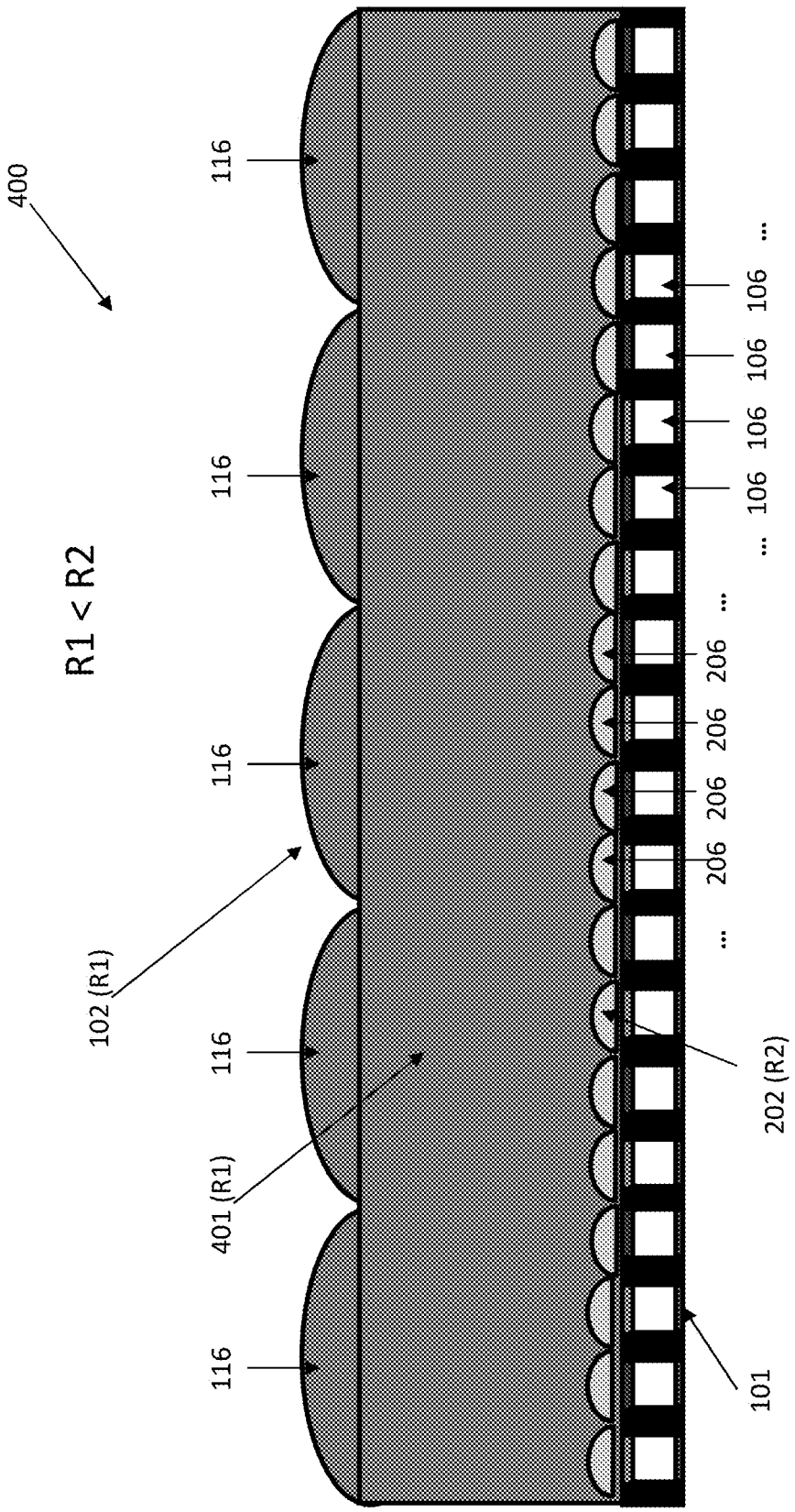
FIG. 4 is a cross-sectional diagram depicting a detail of an optical assembly including a plenoptic MLA and a pixel-level MLA, wherein the optical assembly is fabricated without an air gap according to an embodiment of the present invention, and wherein the index of refraction of the plenoptic MLA and spacing layer is lower than that of the pixel-level MLA.

According to various embodiments of the present invention, an optical assembly including plenoptic MLA 102 is fabricated without the need to introduce an air gap between plenoptic MLA 102 and other components of the optical system. Referring now to FIG. 4, there is shown a cross-sectional diagram depicting a detail of optical assembly 400 including both plenoptic MLA 102 and pixel-level MLA 202, constructed according to an embodiment of the present invention. Plenoptic MLA 102, along with layer 401 of spacing material, are manufactured in such a manner that they adjoin one another. Spacing layer 401 also adjoins pixel-level MLA 202. Such an arrangement avoids the need for an air gap. For example, in at least one embodiment, plenoptic MLA 102 and spacing layer 401 are created from an optical polymer deposited or "spin-coated" on photosensor array 101, and then shaped using photolithographic techniques. Plenoptic MLA 102 and spacing layer 401 may be created at the same time in a single process, or sequentially by first creating spacing layer 401 and then adding plenoptic MLA 102. One method to create the profile for plenoptic MLA 102 is to use a gray-scale mask for photolithography. Once cured, spacing layer 401 and plenoptic MLA 102 are solid. One skilled in the art will recognize, however, that other techniques can be used to generate an optical assembly 400 as shown in FIG. 4.

In the example of FIG. 4, the index of refraction of plenoptic MLA 102 (and spacing layer 401) is lower than that of pixel-level MLA 202. One skilled in the art will recognize, however, that different materials, such as polymers of varying types or other materials of varying refractive indices can be used for the various layers and components. As described herein, variations in the indexes of refractions of the materials can be exploited to achieve desired optical characteristics of the overall assembly 400.

Figure 5:
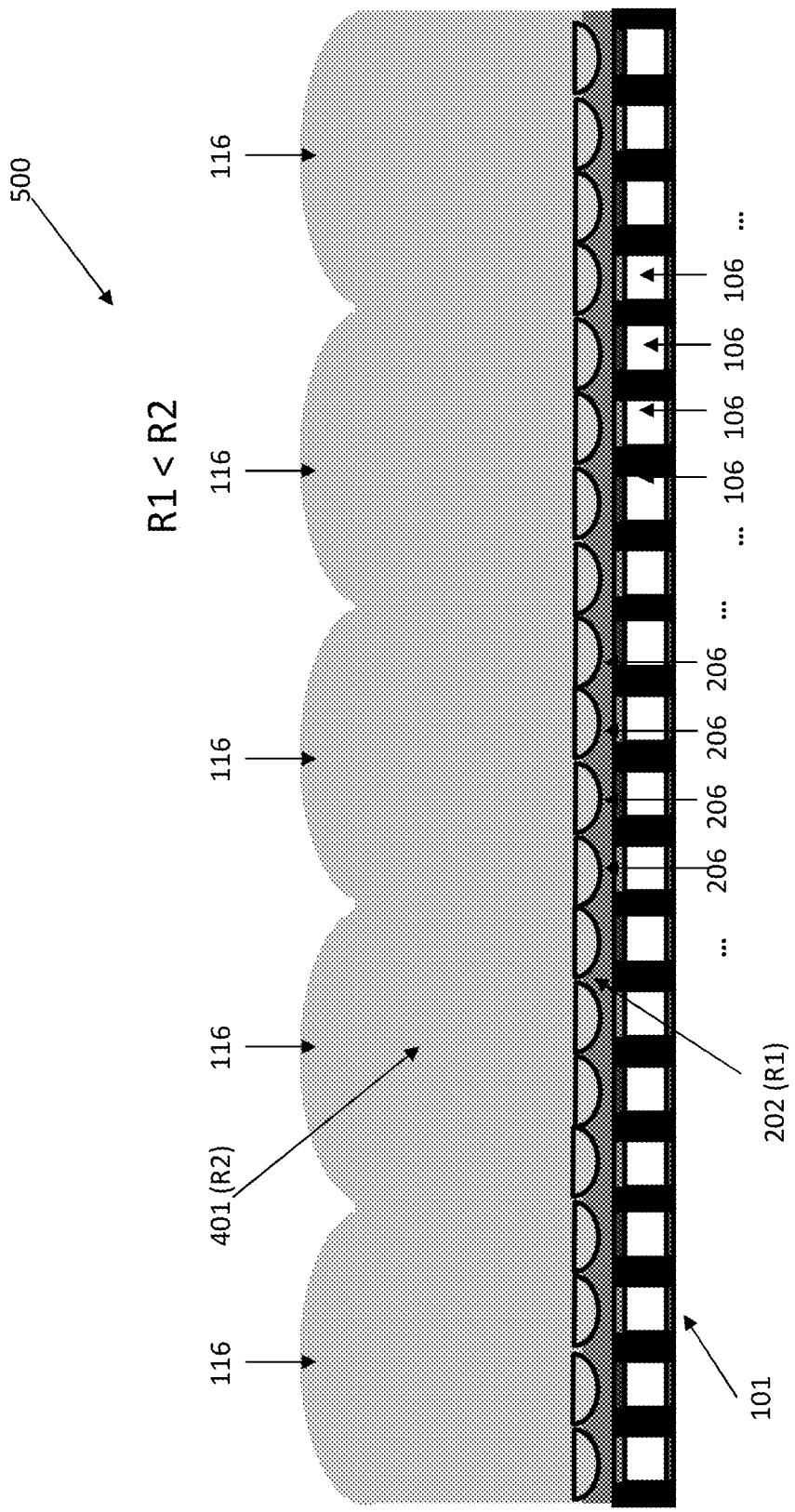
FIG. 5 is a cross-sectional diagram depicting a detail of an optical assembly including a plenoptic MLA and a pixel-level MLA, wherein the optical assembly is fabricated using a photolithographic process according to an embodiment of the present invention, and wherein the index of refraction of the plenoptic MLA and spacing layer is higher than that of the pixel-level MLA.

For example, referring now to FIG. 5, there is shown a cross-sectional diagram depicting a detail of an optical assembly 500 wherein the index of refraction of plenoptic MLA 102 (and spacing layer 401) is higher than that of pixel-level MLA 202. Again, in at least one embodiment, such an assembly 500 can be fabricated using photolithographic processes.

In the examples of FIGS. 4 and 5, the shaping of the microlenses 206 in pixel-level MLA 202 is optimized to focus light on photosensors 106 based on the optical interface between pixel-level MLA 202 and spacing layer 401. In FIG. 4, the index of refraction R1 of plenoptic MLA 102 and spacing layer 401 is lower than the index of refraction R2 of pixel-level MLA 202. In this case, microlenses 206 in pixel-level MLA 202 have a convex shape. Conversely, in FIG. 5, the index of refraction R2 of plenoptic MLA 102 and spacing layer 401 is higher than the index of refraction R1 of pixel-level MLA 202. In this case, microlenses 206 in pixel-level MLA 202 have a concave shape, so as to properly direct light rays onto photosensors 106.

As can be seen from the example configurations shown in FIGS. 4 and 5, the techniques of the present invention avoid the need for mechanical spacing and an air gap, since spacing is accomplished via spacing layer 401 deposited, for example, as part of the photolithographic process. This arrangement results in improved precision in placement of the plenoptic MLA 102.

In at least one embodiment, the techniques of the present invention provide improved horizontal and vertical alignment between plenoptic MLA 102 and other components such as pixel-level MLA 202 and photosensor array 101, by using the precise alignment techniques used in lithographic manufacture. Such improvements in horizontal (x-y) alignment help ensure that microlenses 116 of plenoptic MLA 102 accurately direct light to appropriate locations along pixel-level MLA 202. In at least one embodiment, plenoptic MLA 102 may be created in a manner such that each microlens 116 covers an integral number of pixels (for example, using a square layout with each plenoptic microlens 116 covering an area corresponding to 10×10 photosensors 106 in photosensor array 101). The improved vertical (z) alignment ensures that proper focus is obtained.

In addition, the techniques of the present invention provide reduced error. Lithographic depositing of materials to generate the microlens structures has the potential to produce more precise optics than conventional polymer-on-glass assemblies.

The techniques of the present invention can provide improved reliability and alignment of components, and can reduce manufacturing costs by removing the need for mechanical separators to introduce an air gap. Furthermore, such techniques help to ensure that the plenoptic MLA 102 is constructed in such a manner that the optical performance of pixel-level MLA 202 is not unduly comprised.

Method of Manufacture

In at least one embodiment, the optical assemblies described herein are manufactured using stamping to deposit and shape an optical material directly onto photosensor array 101. The optical material can be any suitable material, such as polymer that can be cured using ultraviolet light. The stamp forms the optical material into the desired shape, including, for example, the convex surfaces that will make up plenoptic MLA 102. In at least one embodiment, the stamping can be performed using a stamp that is transparent or semi-transparent to ultraviolet light, allowing the polymer to be cured while the stamp is in place. Such a mechanism assures precise and accurate positioning of plenoptic MLA 102 with respect to other components.

Figure 11:
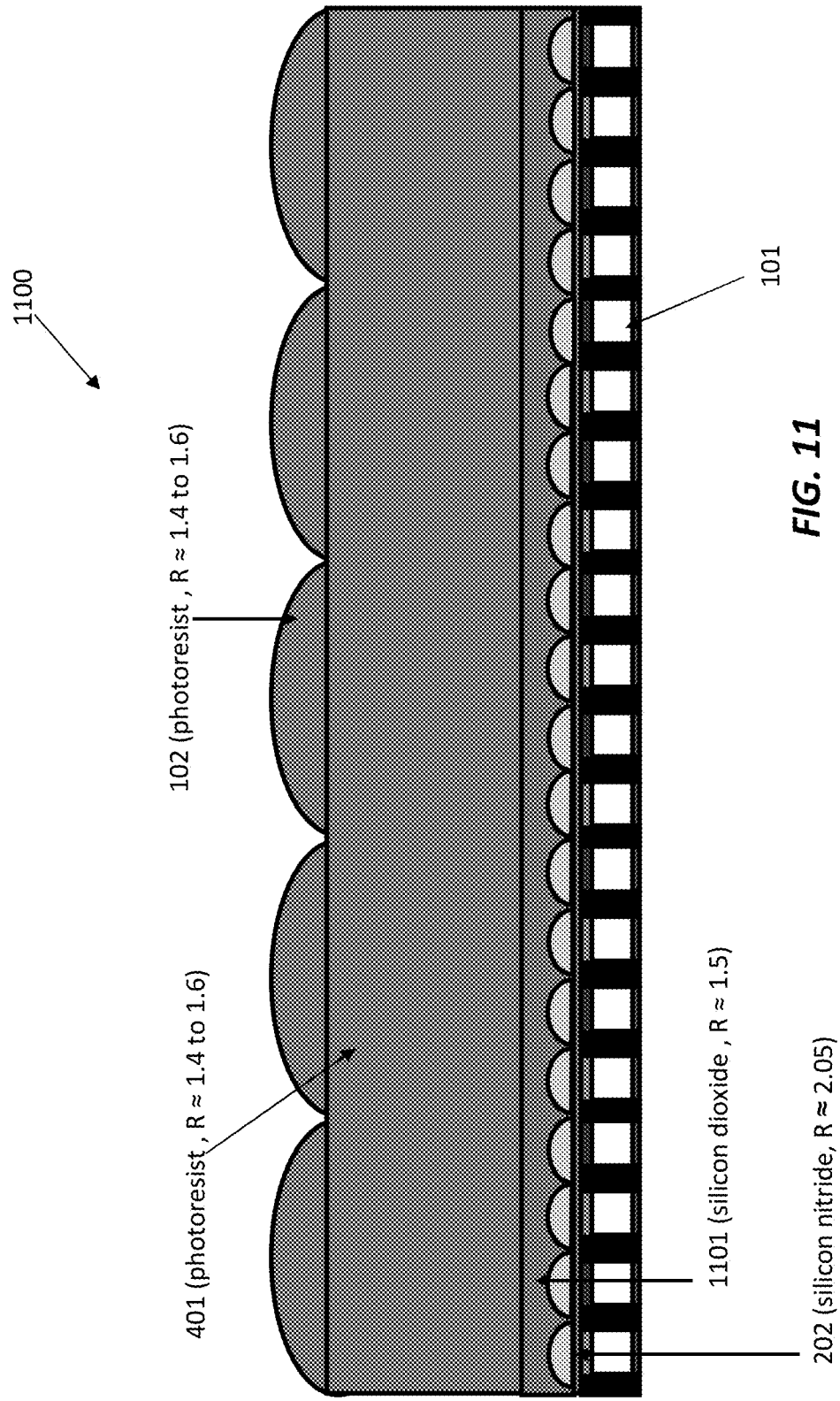
FIG. 11 is a cross-sectional diagram depicting a detail of an optical assembly including a plenoptic MLA and a pixel-level MLA, illustrating multiple steps involved in fabricating the optical assembly using a photolithographic process according to an embodiment of the present invention.
Figure 12:
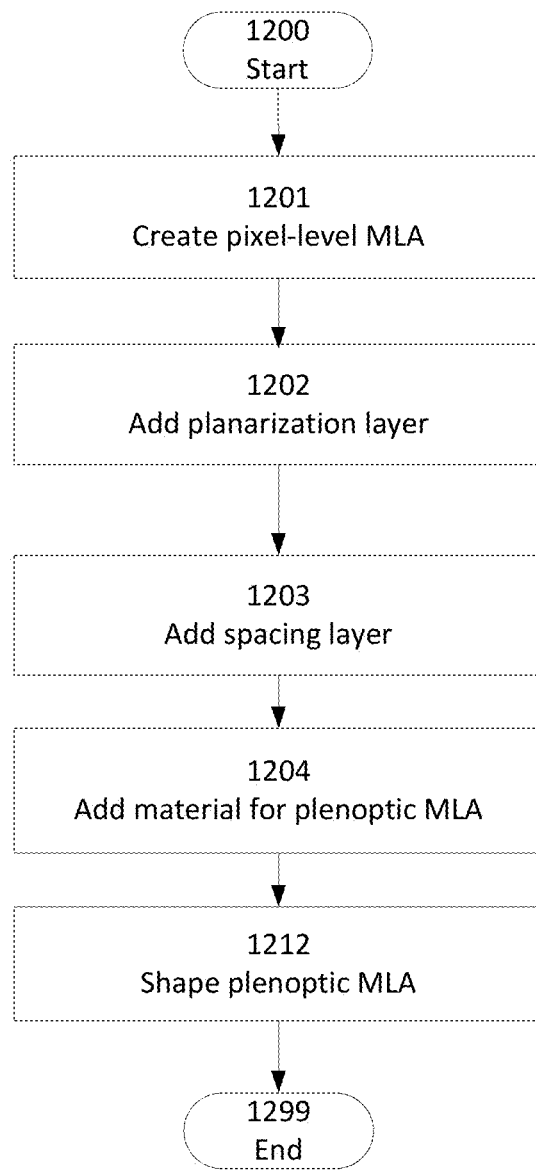
FIG. 12 is a flow diagram depicting a method for fabricating an optical assembly including a pixel-level MLA, spacing layer, and plenoptic MLA, according to an embodiment of the present invention.

Referring now to FIG. 12, there is shown a flow diagram depicting a method for fabricating an optical assembly including a pixel-level MLA 202, spacing layer 401, and plenoptic MLA 102, according to an embodiment of the present invention. Referring also to FIG. 11, there is shown a cross-sectional diagram depicting a detail of an example of an optical assembly 1100 constructed according to the method of FIG. 12.

One skilled in the art will recognize that the particular steps and sequence described and depicted herein are merely exemplary, and that the present invention can be practiced using other steps and sequences. One skilled in the art will recognize that the optical assemblies described herein can be constructed using any suitable material or combination of materials, and that the mention of particular materials and/or properties of such materials herein is merely intended to be exemplary, and is not intended to limit the scope of the invention to those particular materials/or properties of such materials. In particular, the example indexes of refraction depicted and described herein are merely exemplary.

The method begins 1200. Pixel-level MLA 202 is created 1201, using, in at least one embodiment, a material with a very high index of refraction, such as silicon nitride, with an index of refraction of approximately 2.05. In at least one embodiment, lenses 206 of pixel-level MLA 202 are made in a convex shape, and are positioned directly above photosensor array 101. One skilled in the art will also recognize that the pixel-level MLA is a converging lens, and that a converging lens may be made in many shapes and complexities, and that the mention of particular shapes and/or orientations herein is merely intended to be exemplary, and is not intended to limit the scope of the invention. In at least one embodiment, lenses 206 of pixel-level MLA 202 are aligned with sensors 106 of photosensor array 101.

Optionally, planarization layer 1101 is added 1202 on top of pixel-level MLA 202. In at least one embodiment, planarization layer 1101 is formed using a material with a lower index of refraction than that of pixel-level MLA 202, creating an optical interface between planarization layer 1101 and pixel-level MLA 202. An example of a material that can be used for planarization layer 1101 is silicon dioxide, with an index of refraction of approximately 1.5.

In at least one embodiment, optical spacing layer 401 composed of spacing material is added 1203, for example via deposition or spin coating, on top of planarization layer 1101. Spacing layer 401 may be composed of any optically transmissive material, and may be applied in such a manner so that the thickness of layer 401 may be precisely controlled to match the optimal focal length of plenoptic MLA 102, adjusted for the index of refraction of spacing layer 401 material. For example, in at least one embodiment, optically transmissive photoresist may be used to apply spacing layer 401. Spacing layer 401 may be applied using spin-coating, deposition and/or any other suitable process. Preferably, such a process is optimized so as to ensure the addition of a very flat and evenly distributed layer.

Material for plenoptic MLA 102 is then added 1204 on top of optical spacing layer 401. In at least one embodiment, plenoptic MLA 102 is added 1204 by depositing a layer of photoresist with a precisely controlled thickness. This layer of photoresist is developed into plenoptic MLA 102 using any suitable means, such as for example a grayscale mask and photolithographic process. In at least one embodiment, the optical properties of plenoptic MLA 102 are determined in order to provide optimal focus on the plane of pixel-level MLA 202, taking into account all optical materials between plenoptic MLA 102 and pixel-level MLA 202. In at least one embodiment, the layer of photoresist has an index of refraction in the range of 1.4-1.6. Plenoptic MLA 102 is shaped 1212, for example by a stamping process. As described above, in an embodiment wherein the optical material used for plenoptic MLA 202 is a polymer that can be cured using ultraviolet light, the stamp is transparent or semi-transparent to ultraviolet light, allowing the polymer to be cured while the stamp is in place.

In at least one embodiment, spacing layer 401 and plenoptic MLA 102 are constructed from the same material and are deposited at the same time using, for example, a layer of photoresist and grayscale mask photolithography. The single layer is then shaped to form both spacing layer 401 and plenoptic MLA 102, according to known photolithographic techniques. In such an embodiment, steps 1203 and 1204 can be combined into a single step wherein the material for both spacing layer 401 and plenoptic MLA 102 are deposited; in step 1212, stamping is performed to form both spacing layer 401 and plenoptic MLA 102.

In various embodiments, the various layers described and depicted herein, including pixel-level MLA 202, planarization layer 1101, spacing layer 401, and/or plenoptic MLA 102, may be manufactured using any method or process now known or later developed, including, for example, deposition, spin coating, any lithographic method, ion implantation, silicon doping, and/or diffusion.

Referring now to FIGS. 14A through 14C, there is shown a series of cross-sectional diagrams depicting an example of fabrication of a plenoptic MLA 102 and spacing layer 401 using a stamping method, according to an embodiment of the present invention. In FIG. 14A, lens material 1402, such as a polymer or other suitable material, has been dispensed on photosensor array 101. For clarity, pixel-level MLA 202 and other aspects have been omitted from FIGS. 14A through 14C. As described above, such material 1402 can include, for example, a polymer, silicon nitride, photoresist, and/or any other suitable material. MLA stamp 1401 contains indentations 1404 for shaping material 1402 into microlenses for plenoptic MLA 102. Standoffs 1403 are affixed to photosensor array 101 to ensure that stamp 1401 descends to an appropriate distance from photosensor array 101 but no closer. These standoffs 1403 may be used to set the height of spacing layer 401. In at least one embodiment, standoffs 1403 are removable, so that they can be detached after the process is complete.

In FIG. 14B, MLA stamp 1401 has descended so that it forms material 1402 into the appropriate shape for plenoptic MLA 102. In at least one embodiment, a curing process is now performed, for example by exposing material 1402 to ultraviolet light. In at least one embodiment, MLA stamp 1401 is constructed from a material that is optically transmissive with respect to the type of light used for curing, so that curing can take place while stamp 1401 is in the descended position. In at least one embodiment, standoffs 1403 are constructed to allow any excess material 1402 to escape through the sides.

In FIG. 14C, curing is complete and MLA stamp 1401 has been removed. Material 1402 has now formed into plenoptic MLA 102. If desired, standoffs 1403 can now be removed, along with any excess material 1402.

Although FIGS. 14A through 14C depict fabrication of a plenoptic MLA 102, a similar technique can also be used for fabrication of pixel-level MLA 202 and/or other layers of the optical assembly.

Variations

One skilled in the art will recognize that many variations are possible without departing from the essential characteristics of the present invention. The following is an exemplary set of such variations, and is not intended to be limiting in any way.

No Pixel-Level MLA

In at least one embodiment, pixel-level MLA 202 can be omitted. Photolithographic techniques can be used to deposit material for spacing layer 401 and plenoptic MLA 102 directly onto the surface of photosensor array 101. Plenoptic MLA 202 directs light directly onto individual sensors 106 of photosensor array 101.

Multiple Layers of Pixel-Level MLAs

Figure 6:
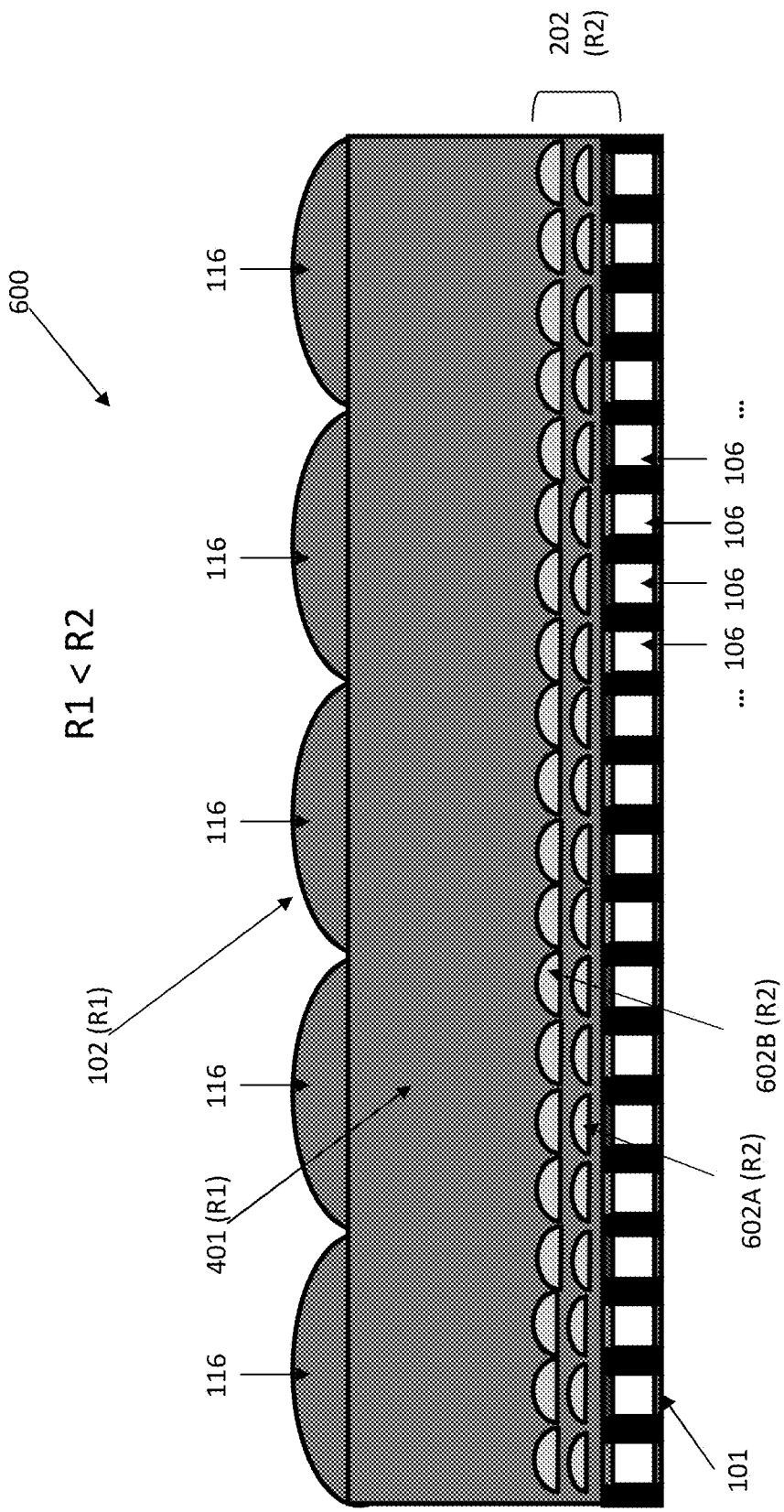
FIG. 6 is a cross-sectional diagram depicting a detail of an optical assembly including a plenoptic MLA and two layers of pixel-level MLAs, wherein the optical assembly is fabricated using a photolithographic process according to an embodiment of the present invention.

Referring now to FIG. 6, there is shown is a cross-sectional diagram depicting a detail of an optical assembly 600 including plenoptic MLA 102 and a two-layer pixel-level MLA 202, wherein optical assembly 600 is fabricated using a photolithographic process according to an embodiment of the present invention. Here, pixel-level MLA 202 is depicted as having two layers 601A, 601B, although any number of layers 601 of pixel-level MLA 202 can be provided. Such an approach can be useful when, for example, the difference in index of refraction between the material used for spacing layer 401 and the material used for the pixel-level MLA 202 is insufficient to obtain the desired degree of optical refraction in a single layer. Layers 601 of pixel-level MLAs 202 can have the same index of refraction as one another, or different indexes of refraction.

Pixel-Level MLA Formed Using GRIN

Figure 7:
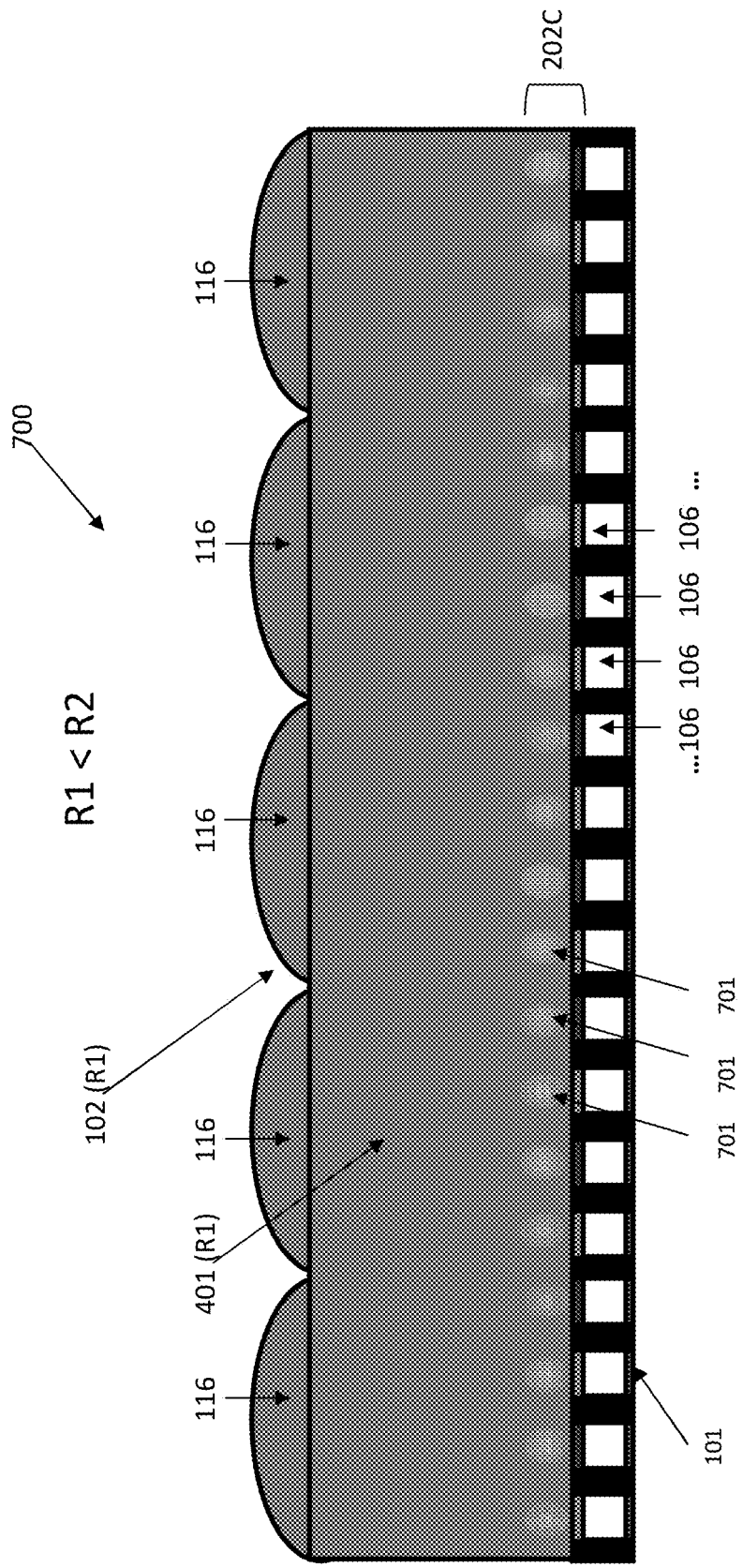
FIG. 7 is a cross-sectional diagram depicting a detail of an optical assembly including a plenoptic MLA and a pixel-level MLA, wherein the pixel-level MLA is fabricated using a material having a gradient index of refraction (GRIN), according to an embodiment of the present invention.

Referring now to FIG. 7, there is shown a cross-sectional diagram depicting a detail of an optical assembly 700 including plenoptic MLA 102 and pixel-level MLA 202C, wherein pixel-level MLA 202C is fabricated using a material having a gradient index of refraction (GRIN), according to an embodiment of the present invention. Such a material is characterized by variations in the index of refraction for different portions of the material. The use of gradient-index optics allows for a great degree of customizability in the optical characteristics of pixel-level MLA 202C. In the example shown in FIG. 7, the optical material is deposited in such a manner that an area 701 of higher index of refraction R2 is positioned above each photosensor 106 in photosensor array 107. These areas 701 of higher index of refraction R2 serve to direct light to photosensors 106, in a similar manner to the microlenses 206 described in connection with FIG. 4 and elsewhere herein. The gradient index may be created using any method now known or later developed. See, for example, R. S. Moore, U.S. Pat. No. 3,718,383, for "Plastic Optical Element Having Refractive Index Gradient", issued Feb. 27, 1973.

Pixel-Level MLA Modified to Match Optical Properties of Plenoptic MLA

Figure 8:
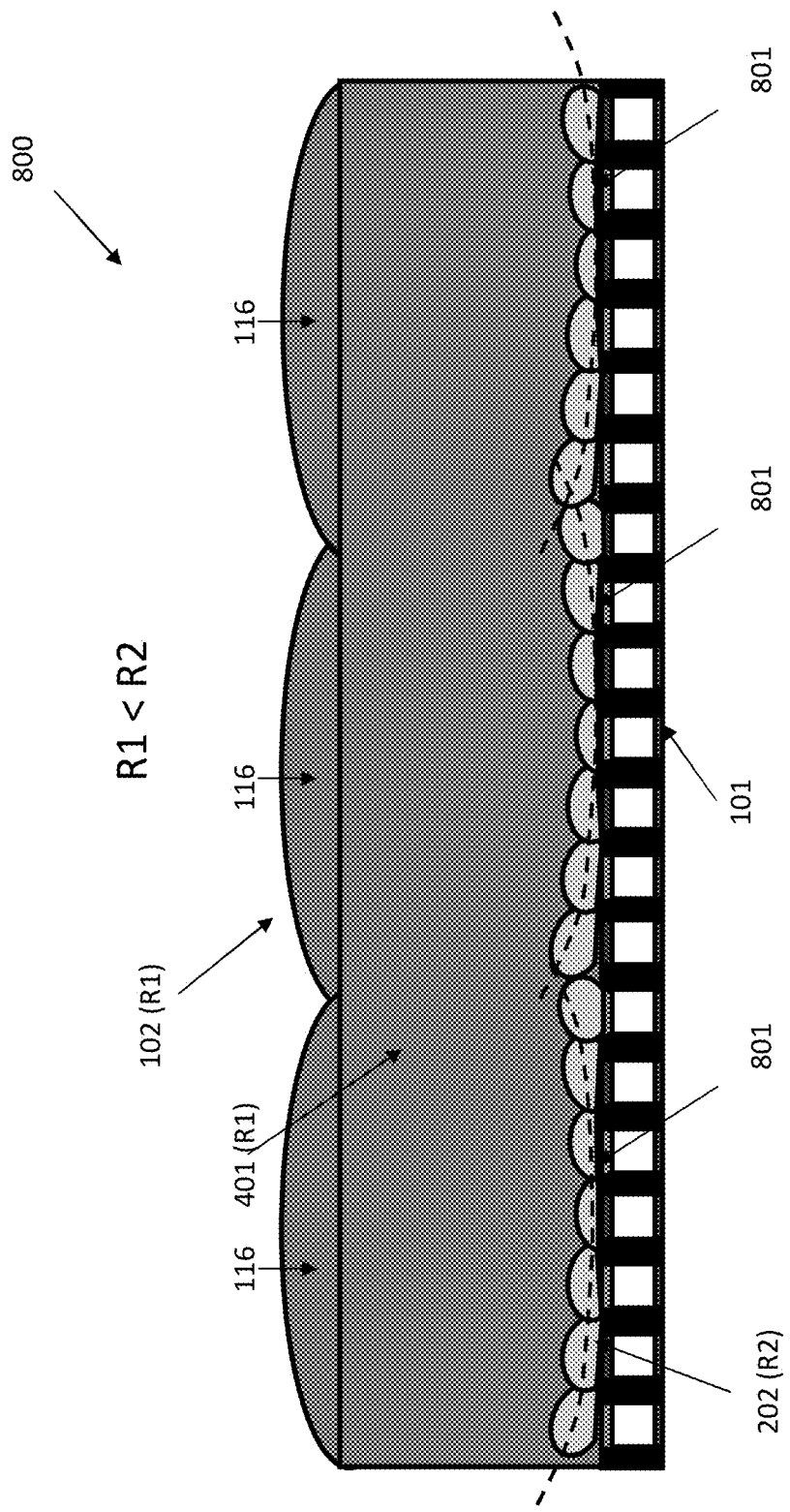
FIG. 8 is a cross-sectional diagram depicting a detail of an optical assembly including a plenoptic MLA and a pixel-level MLA, wherein the pixel-level MLA is fabricated in a manner that matches certain optical properties of the plenoptic MLA, according to an embodiment of the present invention.

Referring now to FIG. 8, there is shown is a cross-sectional diagram depicting a detail of an optical assembly 800 including plenoptic MLA 102 and pixel-level MLA 202D, wherein pixel-level MLA 202D is fabricated in a manner that matches certain optical properties of plenoptic MLA 102, according to an embodiment of the present invention. Specifically, pixel-level MLA 202D is shaped to form a series of concave areas, or bowls 801. In this example, bowls 801 are highly aligned (in X-Y) with individual microlenses 116 in plenoptic MLA 102. Such an arrangement may be useful in situations where plenoptic MLA 102 has significant field curvature. The precise alignment allowed by lithographic techniques facilitate shaping of pixel-level MLA 202D to match the field curvature of plenoptic MLA 102, allowing for better focus and more efficient light capture.

Opaque Microstructures on Pixel-Level MLA

Figure 9:
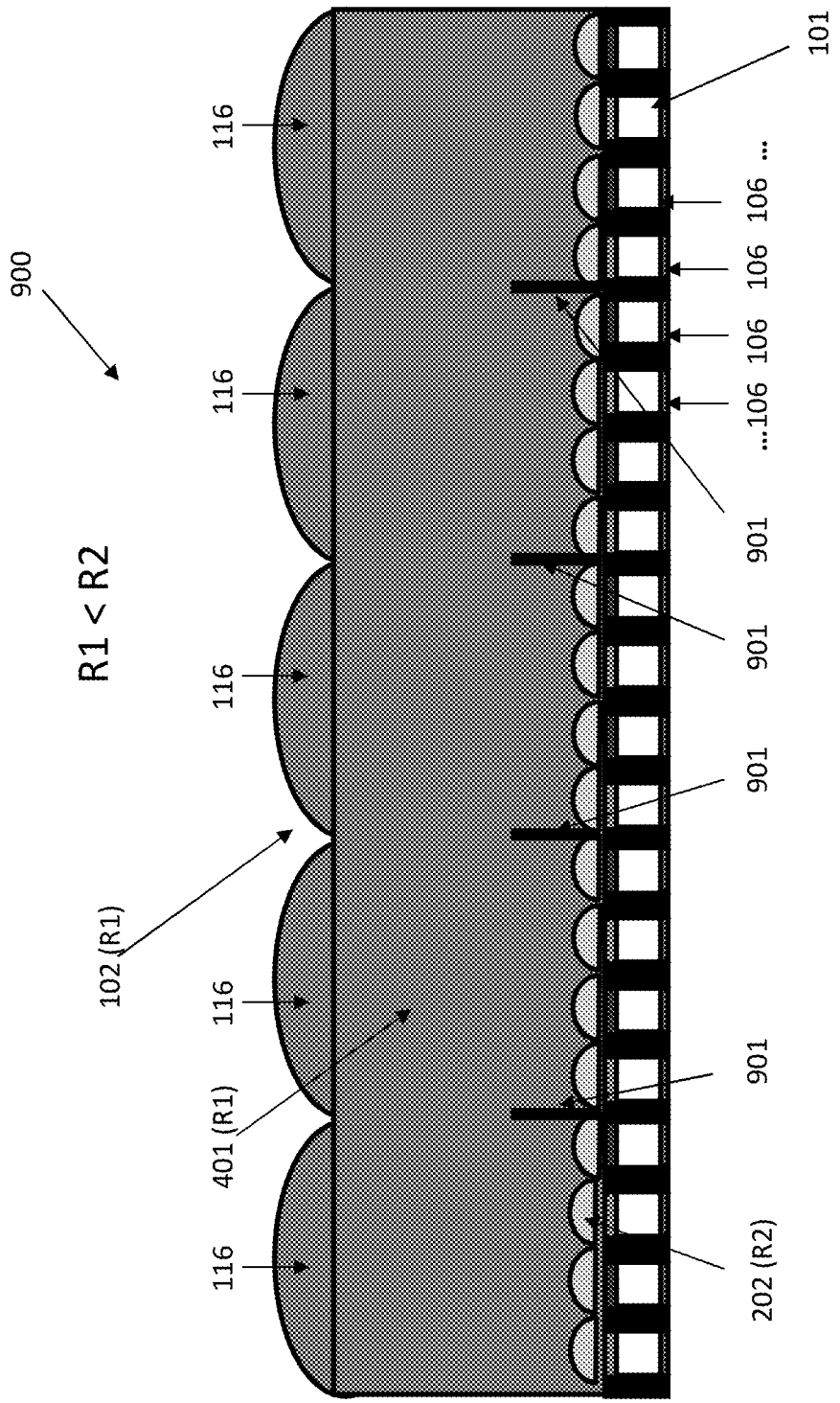
FIG. 9 is a cross-sectional diagram depicting a detail of an optical assembly including a plenoptic MLA and a pixel-level MLA, further including opaque microstructures to block stray light from neighboring microlenses in the plenoptic MLA, according to an embodiment of the present invention.

FIG. 9 is a cross-sectional diagram depicting a detail of an optical assembly 900 including plenoptic MLA 102 and pixel-level MLA 202, further including opaque microstructures 901 to block stray light from neighboring microlenses 116 in plenoptic MLA 102, according to an embodiment of the present invention.

In general, it is optimal if light from one plenoptic microlens 116 does not overlap with light from a neighboring plenoptic microlens 116. In practice, optical aberrations and diffraction often lead to some overlap. In at least one embodiment, this problem is addressed by adding optically opaque microstructures 901 at positions corresponding to the edges of plenoptic microlenses 116; these areas are referred to as lens intersection zones.

Figure 13:
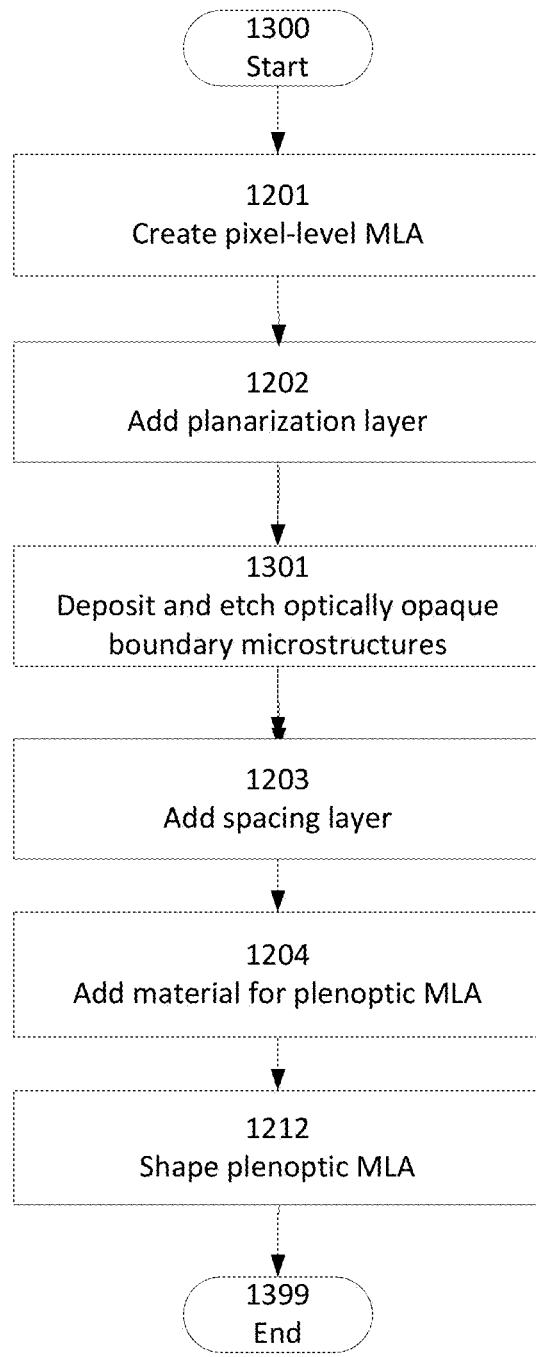
FIG. 13 is a flow diagram depicting a method for fabricating an optical assembly including a pixel-level MLA, spacing layer, plenoptic MLA, and opaque microstructures according to an embodiment of the present invention.

Optical assembly 900 can be constructed using any suitable technique. Referring now to FIG. 13, there is shown a flow chart depicting a method of constructing an optical assembly 900 having opaque microstructures 901 as depicted in the example of FIG. 9.

The method begins 1300. Steps 1201 and 1202 are performed substantially as described above in connection with FIG. 12, so as to create 1201 pixel-level MLA 202 and add 1202 planarization layer 1101. Then, an optically opaque material is deposited and etched 1301, forming boundary microstructures 901. In at least one embodiment, boundary microstructures 901 are generated using a binary photomask and dry etching. If needed, multiple iterations may be deposited to reach the desired height and/or shape. Microstructures 901, which may also be referred to as baffles, can be constructed to be of any desired height, thickness, and/or shape.

In at least one embodiment, microstructures 901 are upright with respect to photosensor array 107. In other embodiments, microstructures 901 may be positioned at angles that vary across the surface of photosensor array 107, for example to match the designated chief ray angle at different positions on photosensor array 107. Thus, different microstructures 901 can have different angles with respect to photosensor array 107, so that they are all correctly oriented with respect to the apparent center of the light reaching photosensor array 107 from a particular plenoptic microlens 116.

In various embodiments, boundary microstructures 901 can be included instead of or in addition to planarization layer 1101 depicted in FIG. 11. Accordingly, step 1202, depicted in FIG. 12, can be included or omitted as appropriate.

Steps 1203, 1204, and 1212 are performed substantially as described in connection with FIG. 12, so as to add 1203 spacing layer, 401, and add 1204 and shape 1212 the material for plenoptic MLA 102. As described above, any suitable technique, such as grayscale photolithography or some other method, can be used to create plenoptic MLA 102.

Multi-Layer Plenoptic MLA

Figure 10:
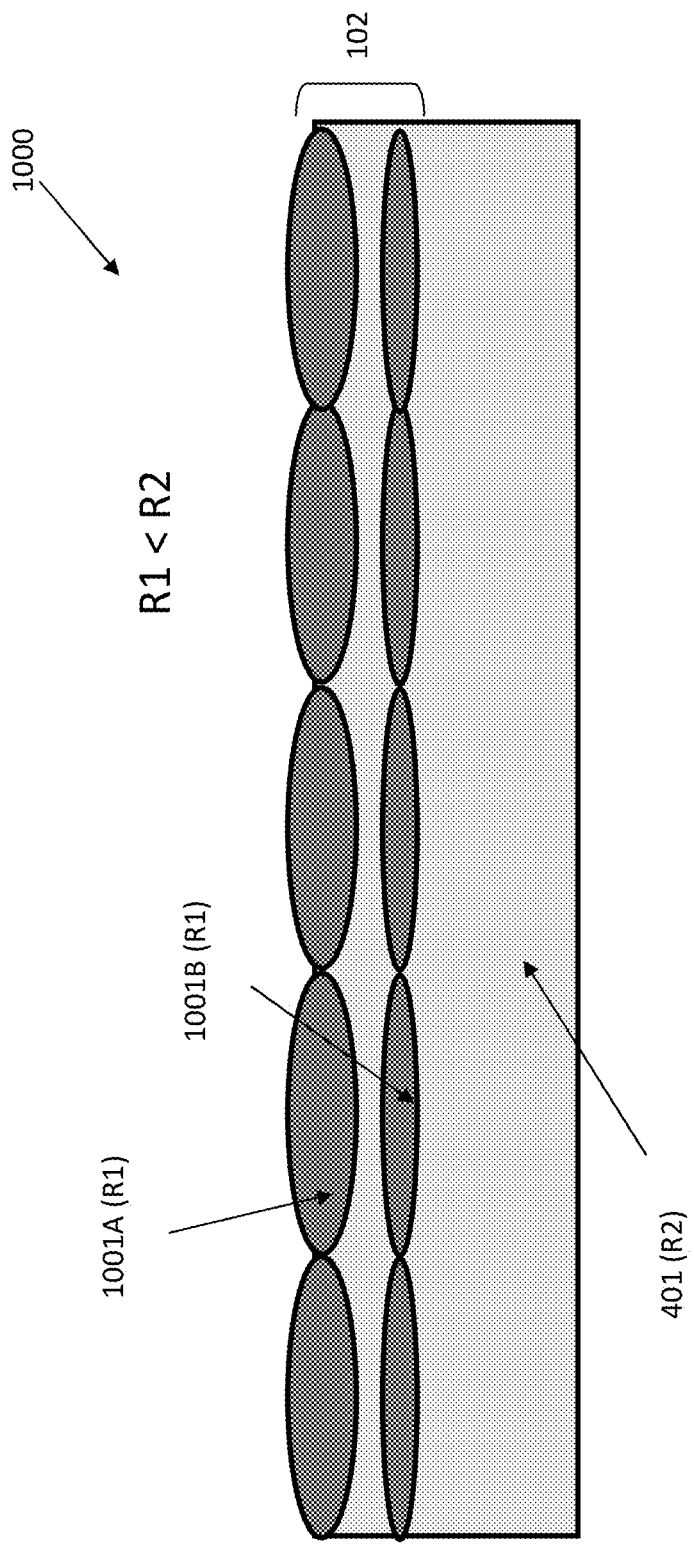
FIG. 10 is a cross-sectional diagram depicting a detail of an optical assembly including a plenoptic MLA having multiple layers, according to an embodiment of the present invention.

Referring now to FIG. 10, there is shown a cross-sectional diagram depicting a detail of an optical assembly 1000 including a plenoptic MLA 102 having multiple layers 1001A, 1001B, according to an embodiment of the present invention. In various embodiments, each layer 1001 can have the same index of refraction or different indexes of refraction. Such a plenoptic MLA 102 can be generated, for example, using successive lithographic steps.

A multi-layer plenoptic MLA 102 as shown in FIG. 10 can be used, for example, when the index of refraction used for plenoptic MLA 102 is insufficient to direct the incoming light in the desired direction. Additionally, the use of multiple optical surfaces may improve the optical performance of plenoptic MLA 202. Any number of layers can be included. Accordingly, such a layering technique may be expanded to create more advanced plenoptic MLAs.

In the example of FIG. 10, plenoptic MLA 102 is deposited on spacing layer 401 having a different index of refraction than that of plenoptic MLA 102 itself. One skilled in the art will recognize that other arrangements are possible, including those in which spacing layer 401 has the same index of refraction as one or both of the layers 1001 of plenoptic MLAs 102. Pixel-level MLA 202 and photosensor array 107 are omitted from FIG. 10 for clarity only.

In the above description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "at least one embodiment" means that a particular feature, structure, or characteristic described in connection with the embodiment is included in at least one embodiment of the invention. The appearances of the phrase "in one embodiment" or "in at least one embodiment" in various places in the specification are not necessarily all referring to the same embodiment.

As will be understood by those familiar with the art, the invention may be embodied in other specific forms without departing from the spirit or essential characteristics thereof. For example, the particular architectures depicted above are merely exemplary of one implementation of the present invention.

The functional elements, components, and method steps described above are provided as illustrative examples of one technique for implementing the invention; one skilled in the art will recognize that many other implementations are possible without departing from the present invention as recited in the claims. The particular materials and properties of materials described herein are merely exemplary; the invention can be implemented with other materials having similar or different properties.

The particular capitalization or naming of the modules, protocols, features, attributes, or any other aspect is not mandatory or significant, and the mechanisms that implement the invention or its features may have different names or formats. In addition, the present invention may be implemented as a method, process, user interface, computer program product, system, apparatus, or any combination thereof. Accordingly, the disclosure of the present invention is intended to be illustrative, but not limiting, of the scope of the invention, which is set forth in the following claims.

While the invention has been described with respect to a limited number of embodiments, those skilled in the art, having benefit of the above description, will appreciate that other embodiments may be devised which do not depart from the scope of the present invention as described herein. In addition, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

What is claimed is:

1. An optical assembly, comprising:
   a photosensor array, comprising a plurality of photosensors;
   a pixel-level microlens array, comprising at least two layers, each layer comprising a plurality of microlenses, each microlens configured to direct light toward a corresponding photosensor of the photosensor array;
   a first spacing layer, comprising a solid optically transmissive material, situated between and adjoining the layers of the pixel-level microlens array and configured to separate the layers of the pixel-level microlens array from one another;
   a second spacing layer, comprising a solid optically transmissive material, adjoining one of the layers of the pixel-level microlens array; and
   a plenoptic microlens array adjoining the second spacing layer, configured to direct incoming light through the second spacing layer and toward the pixel-level microlens array, the plenoptic microlens array having a top surface and a bottom surface;
   wherein the second spacing layer is situated between the pixel-level microlens array and the plenoptic microlens array and is configured to separate the pixel-level microlens array from the plenoptic microlens array.

2. The optical assembly of claim 1, wherein the pixel-level microlens array and the plenoptic microlens array are created using photolithography.

3. The optical assembly of claim 1, wherein the pixel-level microlens array and the plenoptic microlens array are created by stamping and curing.

4. The optical assembly of claim 1, wherein the pixel-level microlens array, the spacing layers, and the plenoptic microlens array are created as successive photolithographically deposited layers.

5. The optical assembly of claim 1, wherein the pixel-level microlens array, the spacing layers, and the plenoptic microlens array are created from the same material.

6. The optical assembly of claim 1, wherein the pixel-level microlens array, the spacing layers, and the plenoptic microlens array are created from the same photolithographically deposited layer.

7. The optical assembly of claim 1, wherein the plenoptic microlens array comprises a plurality of plano-convex microlenses, each plano-convex microlens comprising:
   a flat surface abutting the spacing layer; and
   a convex surface.

8. The optical assembly of claim 1, wherein the pixel-level microlens array, the spacing layers, and plenoptic microlens array are created using photoresist.

9. The optical assembly of claim 1, wherein the plenoptic microlens array comprises a plurality of layers of microlenses.

10. The optical assembly of claim 1, wherein the plenoptic microlens array comprises a plurality of microlenses, wherein each microlens corresponds to an integral number of photosensors of the photosensor array.

11. The optical assembly of claim 1, wherein the plenoptic microlens array comprises a plurality of microlenses, wherein each microlens corresponds to a square comprising an integral number of photosensors of the photosensor array.

12. The optical assembly of claim 1, wherein the second spacing layer adjoins the bottom surface of the plenoptic microlens array.

13. An optical assembly, comprising:
a photosensor array, comprising a plurality of photosensors;
a pixel-level microlens array, comprising at least two layers, each layer comprising a plurality of microlenses, each microlens configured to direct light toward a corresponding photosensor of the photosensor array;
a first spacing layer, comprising a solid optically transmissive material, situated between and adjoining the layers of the pixel-level microlens array and configured to separate the layers of the pixel-level microlens array from one another;
a planarization layer adjoining one of the layers of the pixel-level microlens array, the planarization layer having a top surface and a bottom surface;
a second spacing layer, comprising a solid optically transmissive material, adjoining the top surface of the planarization layer; and
a plenoptic microlens array adjoining the second spacing layer, configured to direct incoming light through the second spacing layer and toward the pixel-level microlens array, the plenoptic microlens array having a top surface and a bottom surface;
wherein the second spacing layer is situated between the planarization layer and the plenoptic microlens array and is configured to separate the planarization layer from the plenoptic microlens array.

14. The optical assembly of claim 13, wherein:
the second spacing layer and the plenoptic microlens array are created from a material having a first index of refraction; and
the planarization layer is created from a material having a second index of refraction different from the first index of refraction.

15. The optical assembly of claim 13, wherein:
the second spacing layer and the plenoptic microlens array are created using photoresist; and
the planarization layer is created using silicon dioxide.

16. The optical assembly of claim 13, wherein the second spacing layer adjoins the bottom surface of the plenoptic microlens array.

17. A method for manufacturing an optical assembly, comprising:
adding a first layer of a pixel-level microlens array to a photosensor array comprising a plurality of photosensors, the first layer comprising a plurality of microlenses, each microlens configured to direct light toward a corresponding photosensor of the photosensor array;
adding a first spacing layer, the first spacing layer comprising a solid optically transmissive material, adjoining the first layer of the pixel-level microlens array; and
adding a second layer of the pixel-level microlens array adjoining the first spacing layer, the second layer comprising a plurality of microlenses, each microlens configured to direct light toward a corresponding photosensor of the photosensor array;
adding a second spacing layer, the second spacing layer comprising a solid optically transmissive material, adjoining the second layer of the pixel-level microlens array; and
adding a plenoptic microlens array adjoining the second spacing layer, configured to direct incoming light through the second spacing layer and toward the pixel-level microlens array, the plenoptic microlens array having a top surface and a bottom surface;
wherein the first spacing layer is added in such a manner as to be situated between the first and second layers of the pixel-level microlens array and configured to separate the layers of the pixel-level microlens array from one another;
and wherein the second spacing layer is added in such a manner as to be situated between the photosensor array and the plenoptic microlens array and configured to separate the photosensor array from the plenoptic microlens array.

18. The method of claim 17, wherein the pixel-level microlens array and the plenoptic microlens array are added using photolithography.

19. The method of claim 17, wherein adding the pixel-level microlens array, the spacing layers, and the plenoptic microlens array comprises adding successive photolithographically deposited layers.

20. The method of claim 17, wherein the pixel-level microlens array, the spacing layers, and the plenoptic microlens array are created from the same material.

21. The method of claim 17, wherein the pixel-level microlens array, the spacing layers, and the plenoptic microlens array are created from the same photolithographically deposited layer.

22. The method of claim 17, wherein adding the plenoptic microlens array comprises adding a plurality of plano-convex microlenses, each plano-convex microlens comprising:
a flat surface abutting the spacing layer; and
a convex surface.

23. The method of claim 17, wherein adding the pixel-level microlens array, the spacing layers, and the plenoptic microlens array comprises creating the pixel-level microlens array, the spacing layers, and the plenoptic microlens array using photoresist.

24. The method of claim 17, wherein adding the plenoptic microlens array comprises adding a plurality of layers of microlenses.

25. The method of claim 17, wherein the second spacing layer adjoins the bottom surface of the plenoptic microlens array.

26. The method of claim 17, wherein adding the plenoptic microlens array comprises adding a plurality of microlenses, wherein each microlens corresponds to an integral number of photosensors of the photosensor array.

27. The method of claim 17, wherein adding the plenoptic microlens array comprises adding a plurality of microlenses, wherein each microlens corresponds to a square comprising an integral number of photosensors of the photosensor array.

28. The method of claim 17, wherein:
adding each layer of the pixel-level microlens array comprises:
stamping the layer of the pixel-level microlens array; and
curing the layer of the pixel-level microlens array; and
adding the plenoptic microlens array comprises:
stamping the plenoptic microlens array; and
curing the plenoptic microlens array.

29. The method of claim 19, wherein:
stamping the layer of the pixel-level microlens array comprises stamping the layer of the pixel-level microlens array using a light-transmissive stamp;
curing the layer of the pixel-level microlens array comprises curing the layer of the pixel-level microlens array through the light-transmissive stamp;

stamping the plenoptic microlens array comprises stamping the plenoptic microlens array using a light-transmissive stamp; and curing the plenoptic microlens array comprises curing the plenoptic microlens array through the light-transmissive stamp.

30. A method for manufacturing an optical assembly, comprising:

adding a first layer of a pixel-level microlens array to a photosensor array comprising a plurality of photosensors, the first layer comprising a plurality of microlenses, each microlens configured to direct light toward a corresponding photosensor of the photosensor array;

adding a first spacing layer, the first spacing layer comprising a solid optically transmissive material, adjoining the first layer of the pixel-level microlens array; and adding a second layer of the pixel-level microlens array adjoining the first spacing layer, the second layer comprising a plurality of microlenses, each microlens configured to direct light toward a corresponding photosensor of the photosensor array;

adding a planarization layer, the planarization layer adjoining the second layer of the pixel-level microlens array, the planarization layer having a top surface and a bottom surface;

adding a second spacing layer, comprising a solid optically transmissive material, adjoining the top surface of the planarization layer; and adding a plenoptic microlens array adjoining the second spacing layer, configured to direct incoming light through the second spacing layer and toward the pixel-level microlens array, the plenoptic microlens array having a top surface and a bottom surface;

wherein the first spacing layer is added in such a manner as to be situated between the first and second layers of the pixel-level microlens array and configured to separate the layers of the pixel-level microlens array from one another;

and wherein the second spacing layer is added in such a manner as to be situated between the planarization layer and the plenoptic microlens array and is configured to separate the planarization layer from the plenoptic microlens array.

31. The method of claim 30, wherein:

adding the second spacing layer and the plenoptic microlens array comprise creating the second spacing layer and the plenoptic microlens from a material having a first index of refraction; and adding the planarization layer comprises creating the planarization layer from a material having a second index of refraction different from the first index of refraction.

32. The method of claim 30, wherein:

adding the second spacing layer and the plenoptic microlens array comprises creating the second spacing layer and the plenoptic microlens array using photoresist; and adding the planarization layer comprises creating the planarization layer using silicon dioxide.

33. The method of claim 30, wherein the spacing layer adjoins the bottom surface of the plenoptic microlens array.

* * * * *